United States Patent
Minkin et al.

(10) Patent No.: US 11,868,872 B1
(45) Date of Patent: Jan. 9, 2024

(54) DIRECT MEMORY ACCESS OPERATION FOR NEURAL NETWORK ACCELERATOR

(71) Applicant: Amazon Technologies, Inc., Seattle, WA (US)

(72) Inventors: Ilya Minkin, Los Altos, CA (US); Ron Diamant, Santa Clara, CA (US); Kun Xu, Austin, TX (US)

(73) Assignee: Amazon Technologies, Inc., Seattle, WA (US)

( * ) Notice: Subject to any disclaimer, the term of this patent is extended or adjusted under 35 U.S.C. 154(b) by 765 days.

(21) Appl. No.: 16/836,493

(22) Filed: Mar. 31, 2020

(51) Int. Cl.
| | |
|---|---|
| *G06N 3/063* | (2023.01) |
| *G06F 12/02* | (2006.01) |
| *G06F 12/1081* | (2016.01) |
| *G06F 13/16* | (2006.01) |
| *G06F 13/28* | (2006.01) |
| *G11C 15/04* | (2006.01) |
| *G06N 3/045* | (2023.01) |

(52) U.S. Cl.
CPC ......... *G06N 3/063* (2013.01); *G06F 12/0292* (2013.01); *G06F 12/1081* (2013.01); *G06F 13/1605* (2013.01); *G06F 13/28* (2013.01); *G06N 3/045* (2023.01); *G11C 15/04* (2013.01); *G06F 2212/152* (2013.01); *G06F 2213/2802* (2013.01)

(58) Field of Classification Search
CPC .... H04L 45/7457; H04L 45/306; H04L 69/22
See application file for complete search history.

(56) References Cited

U.S. PATENT DOCUMENTS

| | | | | |
|---|---|---|---|---|
| 2003/0140196 A1* | 7/2003 | Wolrich | ................... | H04L 49/90 |
| | | | | 711/118 |
| 2005/0091239 A1* | 4/2005 | Ward | ....................... | G06F 9/544 |
| 2015/0120855 A1* | 4/2015 | Izenberg | ................. | G06F 3/067 |
| | | | | 709/212 |
| 2019/0238460 A1* | 8/2019 | Vasudevan | ............ | H04L 45/306 |

* cited by examiner

*Primary Examiner* — Getente A Yimer
(74) *Attorney, Agent, or Firm* — Kilpatrick Townsend & Stockton LLP

(57) ABSTRACT

In one example, an apparatus comprises: a direct memory access (DMA) descriptor queue that stores DMA descriptors, each DMA descriptor including an indirect address; an address translation table that stores an address mapping between indirect addresses and physical addresses; and a DMA engine configured to: fetch a DMA descriptor from the DMA descriptor queue to the address translation table to translate a first indirect address of the DMA descriptor to a first physical address based on the address mapping, and perform a DMA operation based on executing the DMA descriptor to transfer data to or from the first physical address.

20 Claims, 13 Drawing Sheets

DIRECT MEMORY ACCESS OPERATION FOR NEURAL NETWORK ACCELERATOR

BACKGROUND

Artificial neural networks are computing systems with an architecture based on biological neural networks. An artificial neural network can include a set of weights. Through computations as part of an inferencing operation, the weights can be combined with input data to extract information, and a decision can be made based on the information. For example, for a computer vision application to detect an object, the artificial neural network can combine the weights with an input image to extract certain features of the object from the image. Based on the extracted features, the artificial neural network can generate output data to support a decision of whether the object is in the image.

To accelerate the inferencing operation, a neural network hardware accelerator can be used to perform the neural network computations. The neural network hardware accelerator typically includes a local memory to store the input and output data of the neural network computations. The application can generate a request for an inferencing operation, such as the aforementioned computer vision application, which typically executes on a host processor and stores input data (e.g., image data) at a host memory. The input data can be fetched to the local memory of the neural network hardware accelerator as inputs to the inferencing operation. After the inferencing operation completes, the output data can be fetched back to the host memory and to the application.

To avoid burdening the host processor and the neural network processor with memory access operations to transfer the input data and the output data between the host memory and the local memory, a direct memory access (DMA) engine can perform DMA operations on behalf of the host processor and the neural network processor to transfer the input data and the output data. As an inferencing operation typically involves transfer of a large volume of input data as well as output data between the host memory and the local memory, the inferencing operation may involve a large number of DMA operations.

BRIEF DESCRIPTION OF THE DRAWINGS

Various embodiments in accordance with the present disclosure will be described with reference to the drawings, in which.

DETAILED DESCRIPTION

Figure 1:
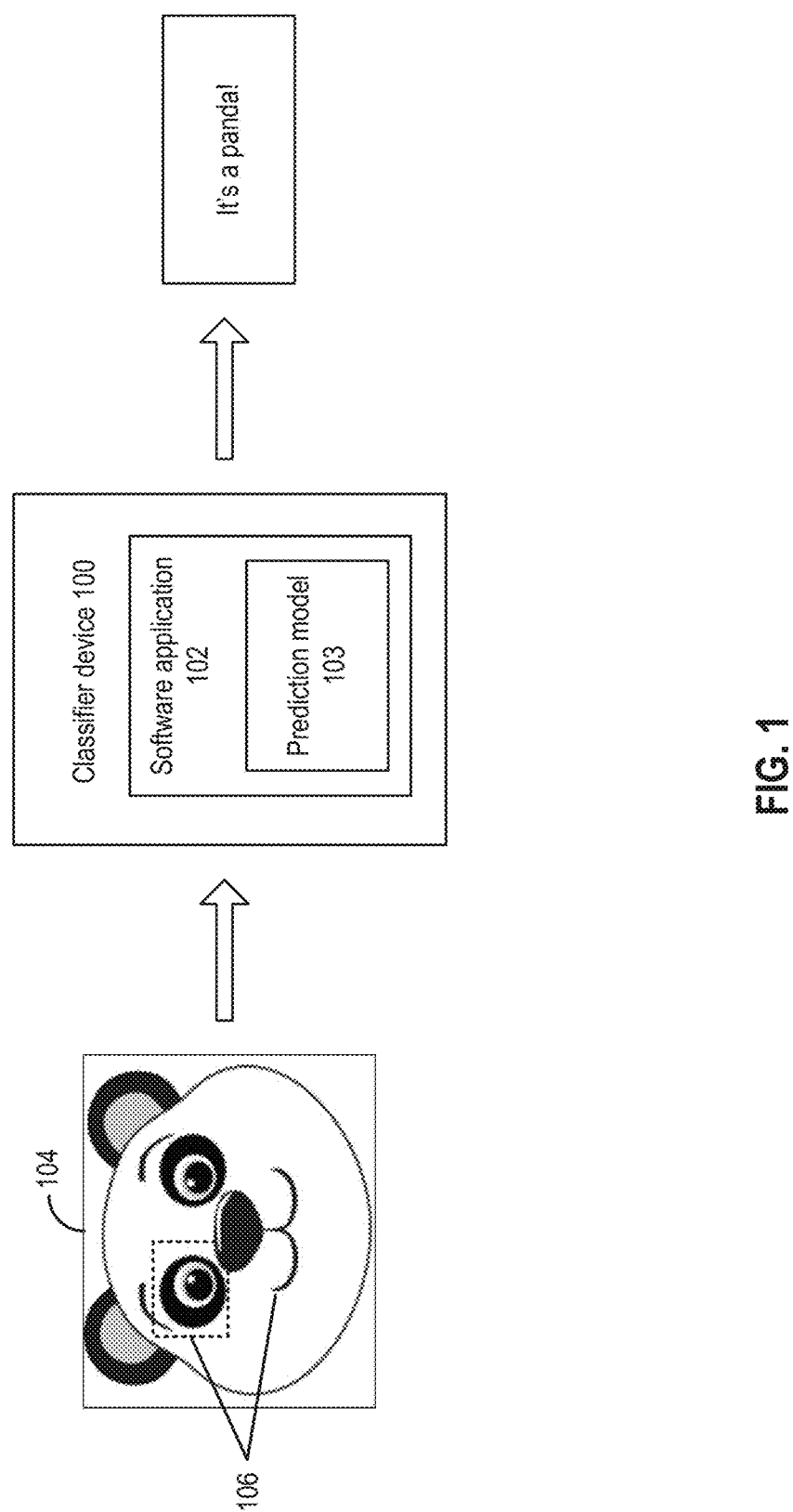
FIG. 1 illustrates an example of a classifier device that uses techniques disclosed herein to process data.

Examples of the present disclosure relate to neural network processing, and more specifically, to performing direct memory access operations for a neural network operation.

An artificial neural network (hereinafter, neural network) is typically implemented in a computing system, such as a neural network processor, to have an architecture based on biological neural networks, and to process input data in an analogous fashion as biological neural networks. A neural network typically includes a number of cascading neural network layers, with each layer including a set of weights. In an inference operation, a first neural network layer can receive an input data set, combine the input data with first weights of the first neural network layer (e.g., by multiplying the input data set with the weights and then summing the products, post-processing the sum, etc.) to generate first intermediate outputs, and propagate the first intermediate outputs to a second neural network layer, in a first forward propagation operation. The second neural network layer performs a second forward propagation operation by combining the first intermediate outputs with second weights of the second neural network layer to generate second intermediate outputs, and propagate the second intermediate outputs to a higher neural network layer. The forward propagation operations can start at the first neural network layer and end at the highest neural network layer. The forward propagation operation at each neural network layer can represent different stages of extraction and processing of information from the input data set.

The output data of the highest neural network can be used to generate a decision. For example, each neural network layer can extract and/or process features from an image, and a decision of whether an object is in the image can be generated based on a result of processing the extracted features at the neural network layers. For some neural network topologies, such as an autoregressive neural network, the output data (of previous input data) can be combined with a set of input data as input to the neural network for a subsequent inferencing operation.

In addition to inferencing operations, there are other types of neural network operations, such as training operations. In training operations, training data can be provided as inputs to the neural network to generate output data based on the weights. The output data can be compared against reference output to generate differences, and the weights can be adjusted to minimize the differences. The training operations typically involve the aforementioned forward propagation operations from the first neural network layer to the highest neural network layer, followed by backward propagation operations from the highest neural network layer back to the first neural network layer. The backward propagation operation at each neural network layer can generate gradients data to update the weights at the respective neural network layer.

To accelerate these neural network operations, a neural network hardware accelerator can be used to perform the neural network computations. The neural network hardware accelerator typically includes a local memory to store the input data and output data of the neural network computations as well as the weights, as well as specialized hardware to perform the computations of the neural network operations. The application that generates the inference/training request typically executes on a host processor and stores input data (e.g., image data) at a host memory. The input data can be fetched to the local memory of the neural network hardware accelerator as inputs to neural network computations. After the neural network hardware accelerator completes the neural network computations, the output data can be fetched back to the host memory and to the application to make a decision, or in a case of autoregressive neural network, to be combined with a new set of input data as input for the subsequent inferencing operation.

A neural network operation, including an inferencing operation and a training operation, typically involves a large number of memory access operations to transfer the input data and output data between the host memory and the local memory. To avoid burdening the host processor and the neural network processor with these memory access operations, a direct memory access (DMA) engine can perform the memory access operations on behalf of the host processor and the neural network processor. To support the DMA operations to fetch the input data from the host memory to the local memory, the host processor that generates the request for a neural network operation can create a set of input data DMA descriptors each including a host input physical address of a portion of the input data in the host memory, a size of the portion of the input data, and a destination location of the portion of the input data in the local memory. The host processor can insert the input data DMA descriptors into an input data DMA descriptor queue of the neural network hardware accelerator. In addition, to support the DMA operations to fetch the output data from the local memory back to the host memory, the host processor can also create a set of output data DMA descriptors each including a source location of a portion of the output data in the local memory, a size of the portion of the output data, and a host output address for storing the portion of the output data in the host memory, and insert the output data DMA descriptors in an output data DMA descriptor queue of the neural network hardware accelerator.

To perform the neural network operation, the neural network hardware accelerator can fetch the input data DMA descriptors from the input data DMA descriptor queue sequentially to a DMA engine. The DMA engine can access the host memory for each portion of the input data, and copy each portion of the input data over to the local memory of the neural network hardware accelerator, based on the information of each input data DMA descriptor. After the fetching of the input data completes, the neural network hardware accelerator can then perform the neural network operation based on the input data stored in the local memory to generate the output data, and store the output data in the local memory. After the neural network operation completes, the neural network hardware accelerator can fetch the output data DMA descriptors from the output data DMA descriptor queue sequentially to the DMA engine. The DMA engine can then fetch each portion of the output data from the local memory, and copy the portion of output data to the host memory, based on the information of each output data DMA descriptor.

As a neural network operation typically involves a large volume of input and output data, while the transfer data size of each DMA descriptor is limited, the host processor may need to create a large number of DMA descriptors to support the transfer of input and output data for the neural network operation. The creation of the large number of the DMA descriptors, as well as the insertion of the large number of DMA descriptors in the DMA descriptor queues, can incur substantial delay. As the neural network operation at the neural network hardware accelerator may need to be put on hold until the DMA descriptors are created and stored in the queues, the neural network operation can also be delayed, which reduces the overall speed and efficiency of the neural network operation.

Examples of the present disclosure relate to neural network processing, and more specifically, to performing direct memory access (DMA) operations to support a neural network operation, which can include an inferencing operation, a training operation, etc.

In one example, an apparatus, which can include a neural network hardware accelerator, includes a data direct memory access (DMA) descriptor queue that stores data DMA descriptors. At least some of the data DMA descriptor each includes an indirect address which can be mapped to different physical addresses. The apparatus further includes an address translation table that stores a mapping between physical addresses of a first memory and indirect addresses of the data DMA descriptors. The first memory can be external to the apparatus (e.g., a host memory of a host processor) and can be involved in the transfer of input data and output data of a neural network operation using the data DMA descriptors. In some examples, the first memory can be part of the apparatus.

The apparatus further includes a second memory to store the input data and the output data of the neural network operation, a DMA engine, and a processor to perform the neural network operation. The address translation table can be part of the DMA engine or external to the DMA engine. The second memory can be a local memory of the apparatus to store the input data and the output data of the neural network operation. The processor can control the DMA engine to fetch and execute a first subset of the data DMA descriptors from the data DMA descriptor queue. The DMA engine can translate the indirect addresses of the first physical addresses of the input data in the first memory via the address translation table, and then execute the data DMA descriptors. In a case where the address translation table is part of the DMA engine, the DMA engine can run the indirect addresses of the data DMA descriptors through the translation table to obtain the first physical addresses, and forward the first physical addresses to the first memory to fetch the input data. In a case where the address translation table is external to the DMA engine (e.g., being part of a data bus between the DMA engine and the rest of the system), the DMA engine can transmit a memory access request including an indirect address based on a data DMA descriptor through the data bus. The data bus (e.g., AXI) can use the address translation table to translate the first indirect address to the first physical address, and forward the memory access request, including the first physical address, to the first memory to fetch the input data.

The processor can then perform the neural network operation based on the input data stored in the second memory to generate the output data, and store the output data in the second memory. The processor can then control the DMA engine to fetch a second subset of the data DMA descriptors from the data DMA descriptor queue and execute the data DMA descriptors. The DMA engine can translate the indirect addresses of the second subset of the data DMA descriptors to second physical addresses in the first memory via the address translation table, and then transfer the output data from the second memory to the second physical addresses of the first memory.

Each of the data DMA descriptors can be statically stored in the data DMA descriptor queue and can be reused for DMA operations of a subsequent neural network operation after being fetched to the DMA engine. The first subset of the data DMA descriptors can be configured to transfer data from the first memory, and each of the first subset of the data DMA descriptors may include an indirect address as a source address which can be translated into a physical address of the first memory. The second subset of the data DMA descriptors can be configured to transfer data to the first memory, and each of the second subset of the data DMA descriptors may include an indirect address as a destination address which can be replaced by a physical address of the first memory. In some examples, both the source and destination addresses of the DMA descriptor may include an indirect address which can be translated into physical addresses by the address translation table. In addition, the data DMA descriptors can be used for transfer of data between different memory devices, or between different physical addresses of the same memory device.

The host processor (based on executing an application) can allocate the physical addresses of the input data and output data in the first memory (e.g., a host memory) for a neural network operation, and can determine an address mapping between the indirect addresses of the data DMA descriptors and the physical addresses. The host processor can then program the address translation table of the apparatus to store the address mapping, and then transmit a request to the apparatus to perform the neural network operation. The processor of the apparatus can process the request, and control the DMA engine to fetch and execute data DMA descriptors. The DMA engine can translate the indirect addresses of the fetched data DMA descriptors to physical addresses via the address translation table and based on the address mapping. The DMA engine can then perform DMA operations to support the neural network operation. The host processor can determine different address mappings between the virtual addresses and the physical addresses for different neural network operations. The host processor can program the address translation table to store a particular address mapping prior to a particular neural network operation, and then program the translation table to store another address mapping prior to a subsequent neural network operation. The host processor can be triggered to program the address translation table based on, for example, executing a pre-determined command in the instructions of the neural network operation.

Specifically, prior to a first neural network operation, the processor can be triggered by a pre-determined command in first instructions of the first neural network operation to program the address translation table with a first address mapping for the first inferencing operation. To support the first neural network operation, the processor can control the DMA engine to fetch and execute data DMA descriptors. The DMA engine can translate the indirect addresses of the data DMA descriptors to first physical addresses via the address translation table and based on the first address mapping, and then perform DMA operations based on the first physical addresses. After the first neural network operation completes and prior to a second neural network operation, the processor can be triggered by the pre-determined command in second instructions of the second neural network operation to program the address translation table with a second address mapping. To support the second neural network operation, the processor has to control the DMA engine to fetch and execute the same set of data DMA descriptors. The DMA engine can translate the indirect addresses via the address translation table to second physical addresses based on the second address mapping, and then perform DMA operations based on the second physical addresses. As a result, the same set of data DMA descriptors can be reused to support multiple neural network operations without the need to create and manage a different set of data DMA descriptors for a different neural network operation.

In some examples, the apparatus can also access the address mapping data based on DMA operations. Specifically, accompanying a request for a neural network operation, the host processor can also generate an address mapping DMA descriptor for accessing the address mapping data, which can be stored in a third memory, which can be part of the first memory (e.g., the host memory), the second memory (e.g., the local memory of the apparatus), or other memory devices. The address mapping DMA descriptor can include information such as the physical address of the address mapping data in the third memory, the size of the address mapping data, etc. The apparatus can receive the address mapping DMA descriptor and the request, and fetch the address mapping data from the third memory using the address mapping DMA descriptor prior to processing the request. In some examples, the apparatus may include an address mapping DMA descriptor queue to store the address mapping DMA descriptors for different address mapping data. The different address mapping data can be for different neural network operations, and/or for fetching of input and output data for the same neural network operation.

Specifically, the processor can fetch a first address mapping DMA descriptor from the address mapping DMA descriptor queue to access first address mapping data, program the address translation table with the first address mapping, use the first address mapping to translate the virtual addresses of the data DMA descriptors to first physical addresses, and control the DMA engine to perform first DMA operations based on the data DMA descriptors having the first physical addresses. After the first DMA operations complete, the processor can fetch a second address mapping DMA descriptor from the address mapping DMA descriptor queue to access second address mapping data, program the address translation table with the second address mapping, use the second address mapping to translate the virtual addresses of the data DMA descriptors to the second physical addresses, and control the DMA engine to perform second DMA operations based on the data DMA descriptors having the second physical addresses.

With the techniques described above, a set of DMA descriptors can be reused for different neural network operations at different times. As a result, a neural network processor need not create and insert a large set of new DMA descriptors into a DMA descriptor queue for each neural network operation, especially in cases where the operations involve movement of a large quantity of input data and output data between the neural network hardware accelerator and the host memory (e.g., for autoregressive neural networks). All these can substantially improve the efficiency of the neural network operations.

In the following description, various examples will be described. For purposes of explanation, specific configurations and details are set forth in order to provide a thorough understanding of the examples. However, it will also be apparent to one skilled in the art that the example may be practiced without the specific details. Furthermore, well-known features may be omitted or simplified in order not to obscure the embodiments being described.

FIG. 1 illustrates an example classifier device 100 that uses techniques disclosed herein to process data. Classifier device 100 can be, for example, a computing device operating a software application 102 and a prediction model 103 to predict information included in a data sequence, and perform a predetermined function based on the prediction. For example, classifier device 100 can be part of an image recognition service provided to identify certain objects (e.g., text, a person, etc.) from an image. It is understood that the image recognition service is merely provided as an illustrative example, and that techniques disclosed herein can be used for other data processing applications including, for example, text-based data processing (e.g., processing search queries), audio data processing, etc. Moreover, classifier device 100 may operate a number of different prediction models to process different input data, either in parallel or at different times.

In some examples, the image recognition service can be provided in a multi-tenant compute service system. The multi-tenant compute service system may typically include a plurality of servers that can host data and be used by multiple clients or organizations to run instances, such as virtual machine instances or bare-metal instances (e.g., operating systems that run directly on the server hardware). In most instances, such as bare-metal or virtual machine instances, a multi-tenant compute service system may be allocated to a client when the client needs them and decommissioned when they are no longer needed, such that the resources can be reallocated to other clients. In the present disclosure, the terms "tenant," "client," and "customer" may be used interchangeably, although such terms do not necessarily imply the existence of any particular business arrangement. The term "instance" may refer to, for example, an instance that is executed directly on server hardware or as a virtual machine. Different types of instances generally correspond to different hardware functions and/or arrangements of hardware (e.g., different amounts of available memory and/or processing hardware). In the example of FIG. 1, the multi-tenant compute service system may provide the image recognition service when the client needs it, and the service is decommissioned when it is no longer needed, such that the resources supporting the image recognition service (e.g., access to software application 102, and the underlying hardware resources for processing software application 102) can be reallocated to other clients. Different clients (or one client) may request application 102 to perform processing of different input data using the same or different prediction models including prediction model 103.

In the example of FIG. 1, software application 102 can receive pixel data of an image 104 from a user. Image 104 may include an array of pixels. Software application 102 can perform analysis on the pixel data, and predict one or more objects 106 depicted in image 104. The analysis may include, for example, comparing the pixel data against a set of predetermined features data. The predetermined features data may include data associated with a set of predetermined visual image features such as, for example, a nose object, a mouth object, etc. The predetermined features data may also include data associated with non-visual image features, or a combination of visual and non-visual image features. As to be discussed in more detail below, software application 102 may employ prediction model 103 to compute a set of scores based on the pixel data of image 104. The set of scores may represent, for example, the likelihood of image 104, including the image features represented by the features data. Software application 102 can then determine other information about the content of image 104 based on the scores. For example, based on the scores, software application 102 can determine that image 104 is an image of, for example, a panda, a cat, or other objects.

Figure 2A:
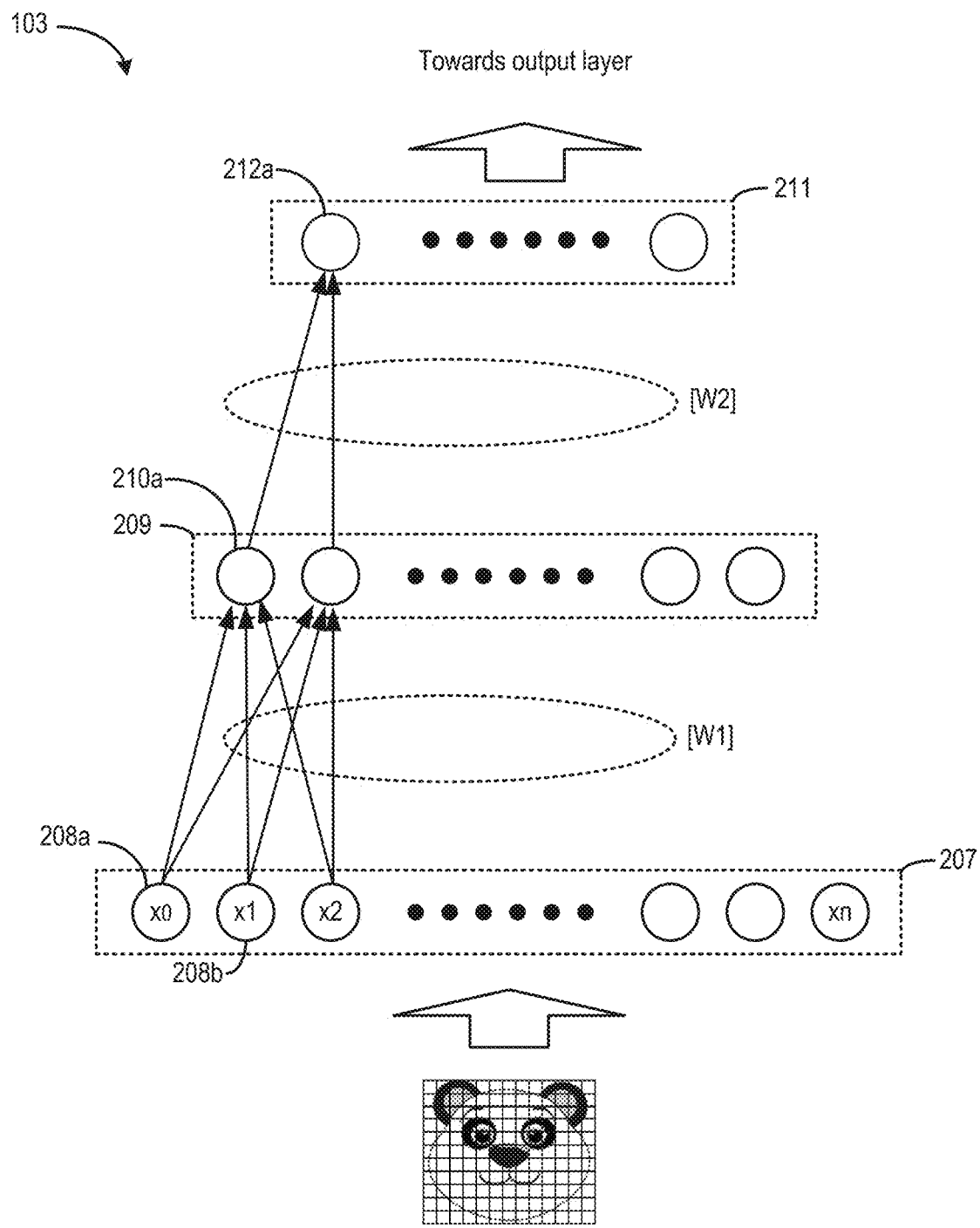
FIGS. 2A-2B are simplified block diagrams illustrating a prediction model and the computations that use techniques disclosed herein, according to certain aspects of the present disclosure.

Prediction model 103 can be in the form of an artificial neural network. The artificial neural network may include a plurality of processing nodes, with each processing node configured to process part of the input pixel data, or to further process the intermediate outputs from other processing nodes. FIG. 1 illustrates an example of prediction model 103 that uses techniques disclosed herein. In FIG. 1, prediction model 103 may be a multi-layer neural network such as a deep neural network (DNN), a convolutional neural network (CNN), etc. Prediction model 103 may include an input layer 207, a set of intermediate layers including intermediate layers 209 and 211, and an output layer (not shown in FIG. 2A). It is understood that prediction model 103 can also include other different types of neural networks including, for example, long short-term memory (LSTM), multilayer perception (MTP), multiscale densenet (MSD-NET), etc.

Layer 207 may process pixel data representing different portions of image 104. For example, in the example of FIG. 2A, layer 207 may process the pixel data of image 204. Each processing node of layer 207 is assigned to receive a pixel value (e.g., $x_0, x_1, x_2, \ldots x_n$) corresponding to a predetermined pixel within image 104, and transmit one or more weights with the received pixel value to layer 209. In a case where prediction model 203 is a DNN, each processing node of layer 207 can be assigned a set of weights defined based on a matrix W1. Each processing node of layer 207 can send the received pixel value and the assigned weights to each processing node of layer 209. In a case where prediction model 103 is a CNN, groups of the processing nodes of layer 207 may share a set of weights, and each group may send the set of weights and the pixel values received by the group of processing nodes to a single processing node of layer 209. Different neural network models may include different topologies (e.g., including a different number of layers, different connections between layers, etc.), and/or include a different set of weights for each layer.

Layer 209 may process the scaled outputs from layer 207 to generate a set of intermediate outputs. For example, assuming processing node 210a of layer 209 is connected to n processing nodes in layer 207, processing node 210a may generate a sum of the scaled outputs received from layer 207 based on the following equation:

$$\text{sum}_{210a} = \Sigma_{i=0}^{n}(W1_i \times x_i) \qquad \text{(Equation 1)}$$

Here, $\text{sum}_{210a}$ represents an intermediate output generated by processing node 210a. $W1_1 \times x_1$ represents a scaling of a particular pixel value (e.g., $x_0$) with the associated weight (e.g., $W1_0$) by a processing node of layer 207. In a case where prediction model 103 is a DNN, each processing node of layer 209 may generate the sum based on the scaling of pixel values from each processing node of layer 207, and then generate a sum (e.g., $\text{sum}_{210a}$) by summing the scaled pixel values. The sum may also represent a dot-product between an input vector comprising a number of elements (e.g., pixel values) and a weight vector (e.g., W1). In some examples, a bias can also be added to the scaled outputs to generate the intermediate output.

Figure 2B:
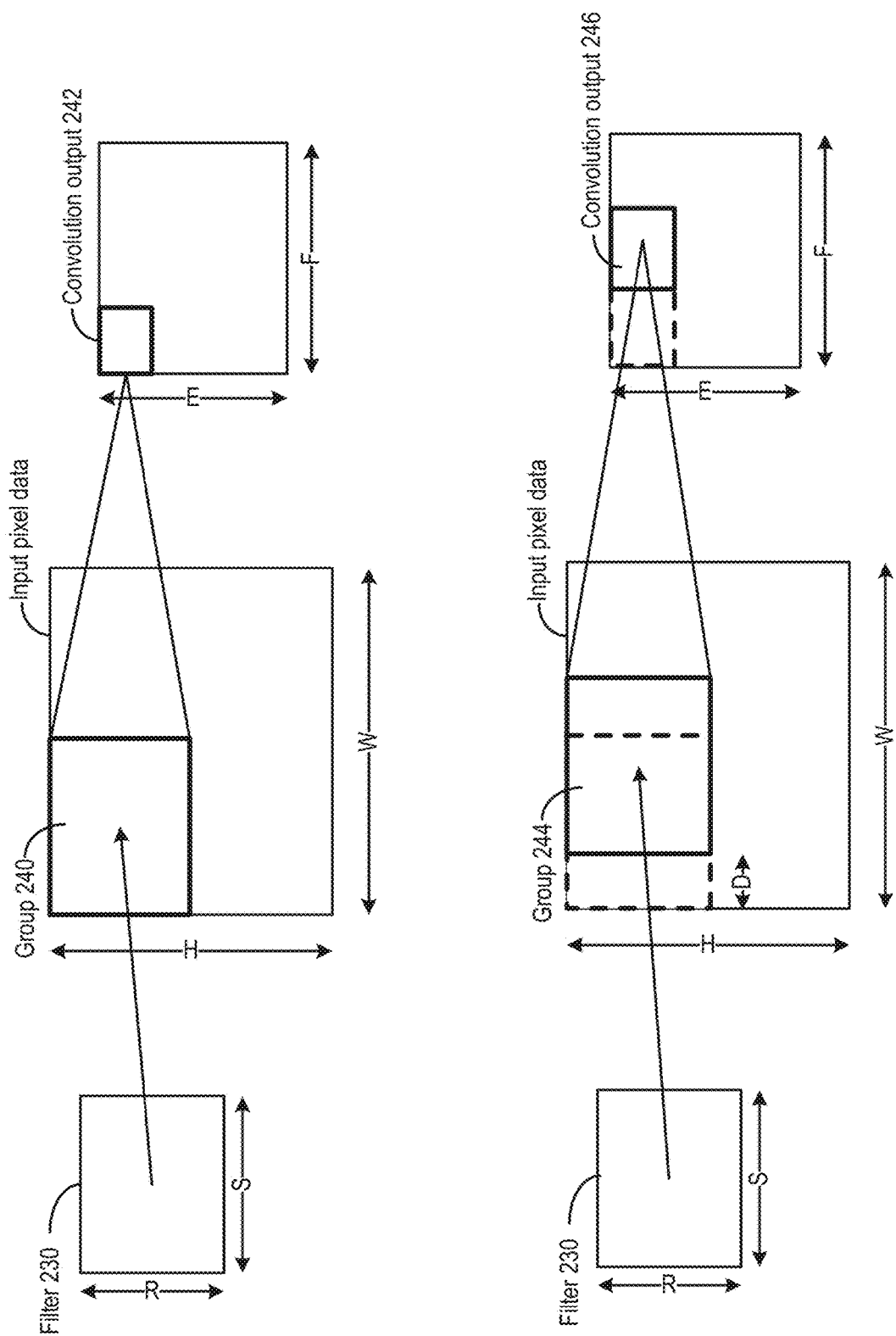

In a case where prediction model 103 is a CNN, each processing node of layer 209 may generate the intermediate output based on the scaling of pixel values from a group of processing nodes of layers 207. The intermediate output may represent a convolution result between a group of pixel values and a filter comprising the weight values. FIG. 2B illustrates an example of a convolution operation that layer 209 may perform. In FIG. 2B, filter 230 may include a two-dimensional array of weights. The weights in filter 230 may represent a spatial distribution of pixels for certain features to be detected from the image. The two-dimensional array may have a height of R rows and a width of S columns, and is typically smaller than an input image with a height of H pixels and a width of W pixels. Each weight may be mapped to a pixel in a rectangular block of pixel values with the same R rows and S columns. A processing node of layer 209 (e.g., processing node 210a) can receive, from a group of processing nodes of input layer 207, a group 240 of pixel values corresponding to a first rectangular block of pixels from the input image, which corresponds to a first stride location of filter 230, and generate a convolution output 242 based on a summation of multiplication results between each weight of filter 230 and each corresponding pixel in group 240 according to Equation 1, to generate a dot-product between a matrix represented by filter 230 and a matrix represented by group 240. Another processing node of layer 209 can also receive, from another group of processing nodes of input layer 207, a group 244 of pixel values corresponding to a second rectangular block of pixels from the input image corresponding to a second stride location of filter 230, and generate a convolution output 246 based on a summation of multiplication results between each weight of filter 230 and each corresponding pixel in group 244 according to Equation 1, to generate a dot-product between the matrix of filter 230 and a matrix represented by group 240. In some examples, each convolution output in FIG. 2B (e.g., convolution output 242, convolution output 346, etc.) can correspond to the output of a processing node of layer 209. In some examples, the pixel data in the input image may be referred to as an input feature map to indicate that the pixels are processed by the same filter (or same set of filters) corresponding to certain feature(s). The convolution outputs may be referred to as an output feature map to indicate that the output is the result of processing an input feature map with the filter.

As shown in FIG. 2B, the convolution operations can be arranged in a sliding-window such that the second rectangular block overlaps, or is otherwise adjacent to, the first rectangular block in the input image. For example, in the example of FIG. 2B, D may be a distance of stride (in pixel) of the sliding-window for each convolution operation, such that the block of pixels corresponding to group 244 may be situated at a distance D (in terms of pixels) from the block of pixels corresponding to group 240, and the next block of pixels may also be situated at the same distance D from group 244. Other processing nodes of layer 209 may also receive groups of pixels corresponding to other rectangular blocks and generate other intermediate outputs. The convolution outputs can be part of a convolution output array. The array of convolution outputs can have a smaller height and a smaller width than the input image. Rectangular blocks of the convolution outputs can be further grouped, and convolution operations can be performed at layer 211 between the groups of convolution outputs and another set of filter weights to generate another set of convolution outputs.

Referring back to FIG. 2A, one processing node of layer 209 may be configured to generate the convolution output elements of one convolution output array, and a set M of processing nodes of layer 209 can correspond to a set M of convolution output arrays. The processing node of layer 209 can also process each convolution output with an activation function to generate an activation output. The activation function may translate the convolution output into a decision of whether to forward the convolution output to intermediate layer 211 to influence the classifier decision (analogous to the firing of a biological neuron). An example of the activation function can be a rectified linear unit (ReLU) defined according to the following equation:

$$ReLU(x) = \begin{cases} x & \text{for } x \geq 0 \\ 0 & \text{for } x < 0 \end{cases} \quad \text{(Equation 2)}$$

In addition to ReLU, other forms of activation function can also be used including, for example, a softplus function (which can be a smooth approximation of a ReLU function), a hyperbolic tangent function (tanh), an arc tangent function (arctan), a sigmoid function, a Gaussian function, etc.

A processing node of layer 209 (e.g., processing node 210a) may process the sum with the ReLU function to generate a first output of layer 209 based on the following equation:

$$\text{first\_output}_{210a} = ReLU(\text{sum}_{210a}) \quad \text{(Equation 3)}$$

Optionally, prediction model 103 may include a pooling layer to reduce the number of intermediate outputs (e.g., $\text{sum}_{210a}$) of layer 209. The pooling layer may group the intermediate outputs and perform a pooling operation on each group. The pooling operation may include such as max pooling (e.g., selecting a maximum intermediate output within the group), min. pooling (e.g., selecting a minimum intermediate output), average pooling (e.g., finding an average of each group), summation pooling (finding a sum of each group), etc., and the reduced intermediate outputs can be processed by the activation function to generate first outputs of layer 209. The pooling operation can be performed to reduce the computation cost associated with activation function processing.

Layer 211 may further process the scaled intermediate outputs from layer 209 by, for example, performing additional convolution operations based on different sets of filters. The outputs from each processing node of layer 211 (e.g., node 212a) may be forwarded to other higher intermediate layers, or to an output layer (not shown in FIG. 2A). The output layer may form an output vector representing, for example, a probability that certain features are included in image 104, and/or a probability that image 204 includes an image of a panda. For example, the output vector may be compared against a reference vector associated with a nose object of a panda, or a reference vector associated with a panda. A decision about whether image 104 is an image of a panda can be determined based on the comparison result.

To accelerate the neural network operations described above in FIG. 1-FIG. 2B, a neural network hardware accelerator can be used to perform the neural network computations. The neural network hardware accelerator typically includes a local memory to store the input data and output data of the neural network computations as well as the weights, as well as specialized hardware to perform the computations of the neural network operations. An application being executed on a host processor can generate a request for a neural network operation, and store input data (e.g., image data) at a host memory. The input data can be fetched to the local memory of the neural network hardware accelerator as inputs to the neural network operation. After the neural network hardware accelerator completes the operation, the output data can be fetched back to the host memory and to the application to make a decision, or in a case of autoregressive neural network, to be combined with a new set of input data as input for the subsequent inferencing operation.

A neural network operation, including an inferencing operation and a training operation, typically involves a large number of memory access operations to transfer the input data and output data between the host memory and the local memory. To avoid burdening the host processor and the neural network processor with these memory access operations, the neural network hardware accelerator may include a direct memory access (DMA) engine which can perform the memory access operations on behalf of the host processor and the neural network processor to perform these memory access operations.

Figure 3:
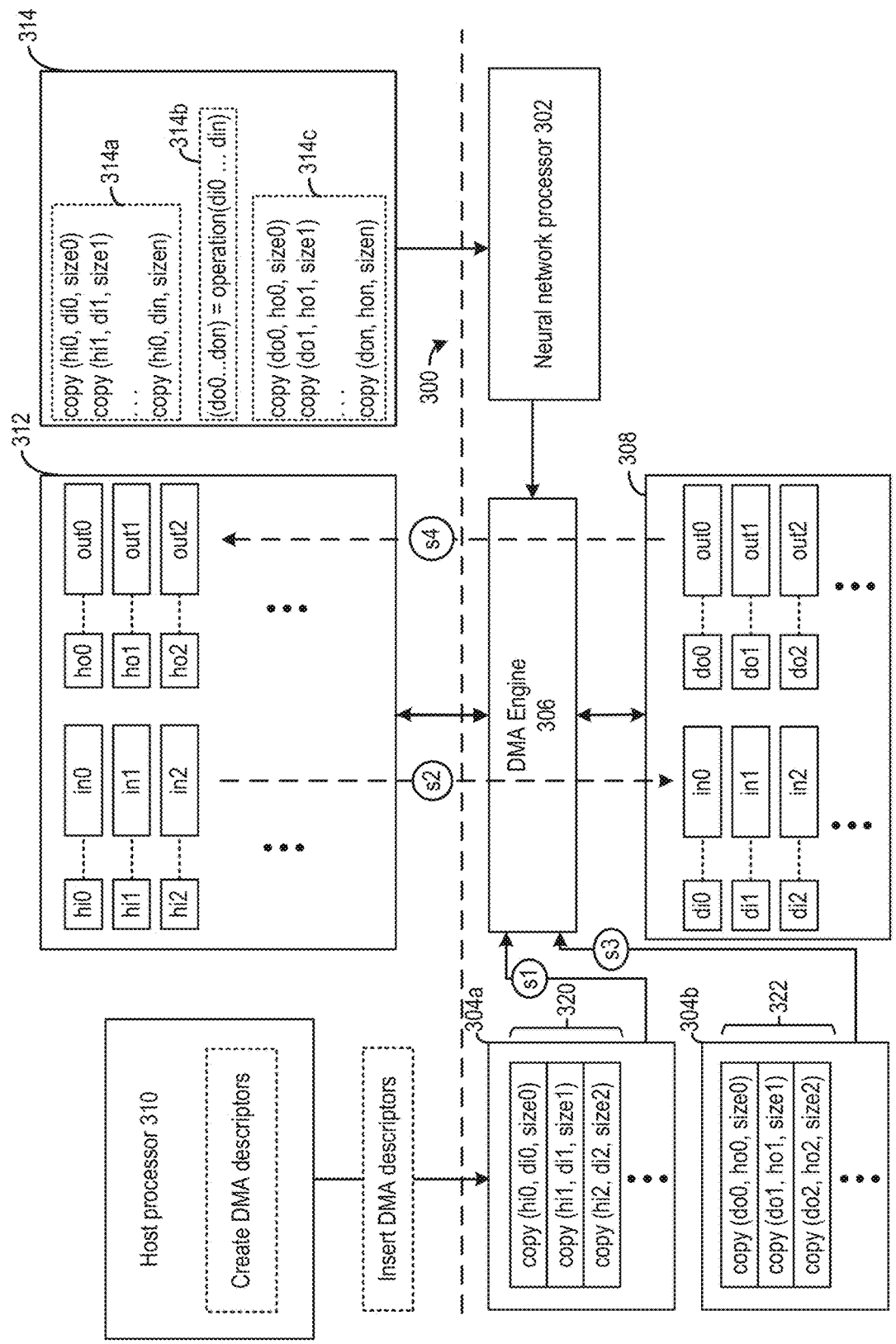
FIG. 3 illustrates an example neural network hardware accelerator and its direct memory access (DMA) operations, according to certain aspects of the present disclosure.

FIG. 3 illustrates an example neural network hardware accelerator 300 and example DMA operations involving neural network hardware accelerator 300. As shown in FIG. 3, neural network hardware accelerator 300 includes a neural network processor 302, an input data DMA descriptor queue 304a, and output data DMA descriptor queue 304b, a DMA engine 306, and a local memory 308. Neural network hardware accelerator 300 may be coupled with a host processor 310 and a host memory 312. Host processor 310 can transmit a request to neural network hardware accelerator 300 to perform a neural network operation. Host processor 310 can also dynamically allocate physical addresses in host memory 312 to support the neural network operation. For example, host processor 310 can allocate host input physical addresses (e.g., hi0, hi1, hi2, etc.) to store input data (e.g., in0, in1, in2, etc.) to the neural network operation, as well as host output physical addresses (e.g., ho0, ho1, ho2, etc.) to store output data (e.g., out0, out1, out2, etc.) of the neural network operation. The input data can be fetched from host memory 312 to local memory 308, whereas the output data can be fetched from local memory 308 to host memory 312. The fetching of the input and output data can be performed based on direct memory access (DMA) operations.

Referring to FIG. 3, to support the DMA operations to fetch the input data from host memory 312 to local memory 308, host processor 310 can create a set of input data DMA descriptors 320 each including a host input physical address (e.g., hi0, hi1, hi2, etc.) of a portion of the input data in host memory 312, a size of the portion of the input data, and a destination location (e.g., di0, di1, di2, etc.) of the portion of the input data in local memory 308. Host processor 310 can then insert input data DMA descriptors 320 into input data DMA descriptor queue 304a. In addition, to support the DMA operations to fetch the output data from local memory 308 back to host memory 312, host processor 310 can also create a set of output data DMA descriptors 322 each including a source location (e.g., do0, do1, do2, etc.) of a portion of the output data in local memory 308, a size of the portion of the output data, and a host output physical address (e.g., ho0, ho1, ho2, etc.) for storing the portion of the output data in local memory 308, and insert output data DMA descriptors 322 in output data DMA descriptor queue 304b.

Host processor 310 can then transmit a request to neural network hardware accelerator 300 to perform a neural network operation. Neural network hardware accelerator 300 may also receive a set of instructions 314 of the neural network operation either from host processor 310 or from a different source. Instructions 314 may include instructions 314a to fetch portions of input data portions from host input physical addresses of host memory 312 (e.g., hi0, hi1, hi2, etc.) to local input addresses (e.g., di0, di1, din, etc.) of local memory 308. Instructions 314 may also include instruction 314b to perform the neural network operation based on input data at the local input addresses of local memory 308, and store the output data portions (e.g., out0, out1, out2, etc.) at local output addresses (e.g., do0, do1, do2, etc.) of local memory 308. Instructions 314 may include instructions 314c to fetch the output data from local output addresses of local memory 308 to host output physical addresses of host memory 312 (e.g., ho0, ho1, ho2, etc.). Instructions 314 can be executed by neural network processor 302 of neural network hardware accelerator 300.

As a result of executing instructions 314a to fetch input data, neural network processor 302 can control DMA engine 306 to fetch input data DMA descriptors 320 from input data DMA descriptor queue 304a, in operations labelled "s1a" in FIG. 3. Based on each of input data DMA descriptors 320, DMA engine 306 can perform a DMA operation to fetch an input data portion (e.g., in0, in1, in2, etc.) from the host input physical addresses of host memory 312, and then store the input data portions at the local input addresses of local memory 308, in operations labelled "s2" in FIG. 3. After input data DMA descriptors 320 are fetched, they can be deleted/removed from input data DMA descriptor queue 304a.

Moreover, after neural network processor 302 completes execution of instruction 314b and stores the output data portions (e.g., out0, out1, out2, etc.) at local output addresses (do0, do1, do2, etc.) of local memory 308, neural network processor 302 can execute instructions 314c to fetch the output data portions back to host memory 312. As a result of executing instructions 314c, neural network processor 302 can control DMA engine 306 to fetch output data DMA descriptors 322 from output data DMA descriptor queue 304b in operations labelled "s3" in FIG. 3. Based on each of output data DMA descriptors 322, DMA engine 306 can perform a DMA operation to fetch an output data portion (e.g., out0, out1, out2, etc.) from the local output addresses of local memory 308, and then store the output data portions at the host output physical addresses of host memory 312, in operations labelled "s4".

As a neural network operation typically involves a large volume of input and output data, while the transfer data size of each DMA descriptor is limited, neural network processor 302 may need to create a large number of data DMA descriptors 320 and 322 to support the transfer of input data and output data for the neural network operation. The creation of the large number of the DMA descriptors 320 and 322, as well as the insertion of the large number of DMA descriptors into descriptor queues 304a and 304b, can add substantial delay to the neural network operation.

Figure 4A:
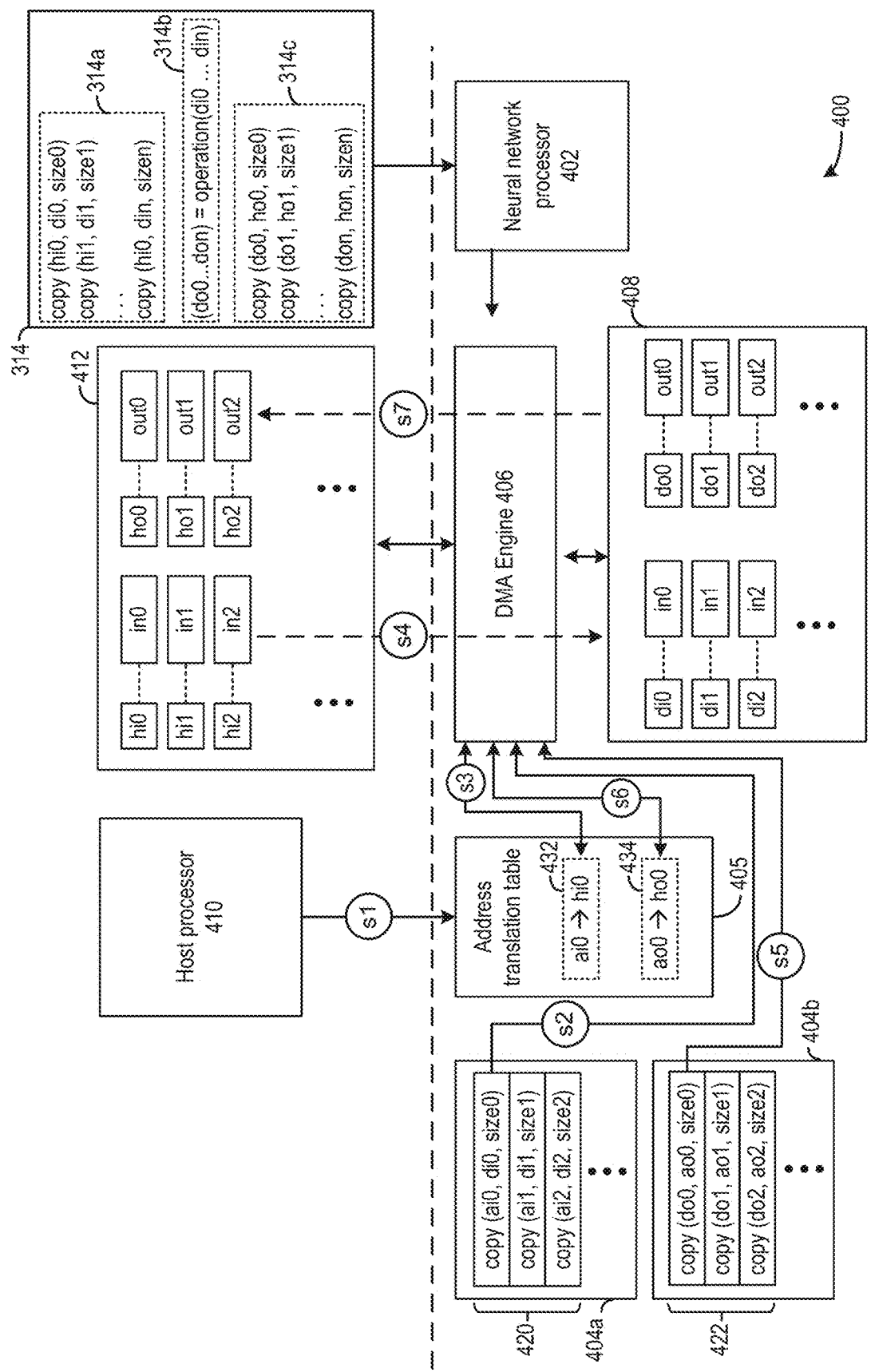
FIGS. 4A-4D illustrate other examples of neural network hardware accelerator and their DMA operations, according to certain aspects of the present disclosure.
Figure 4B:
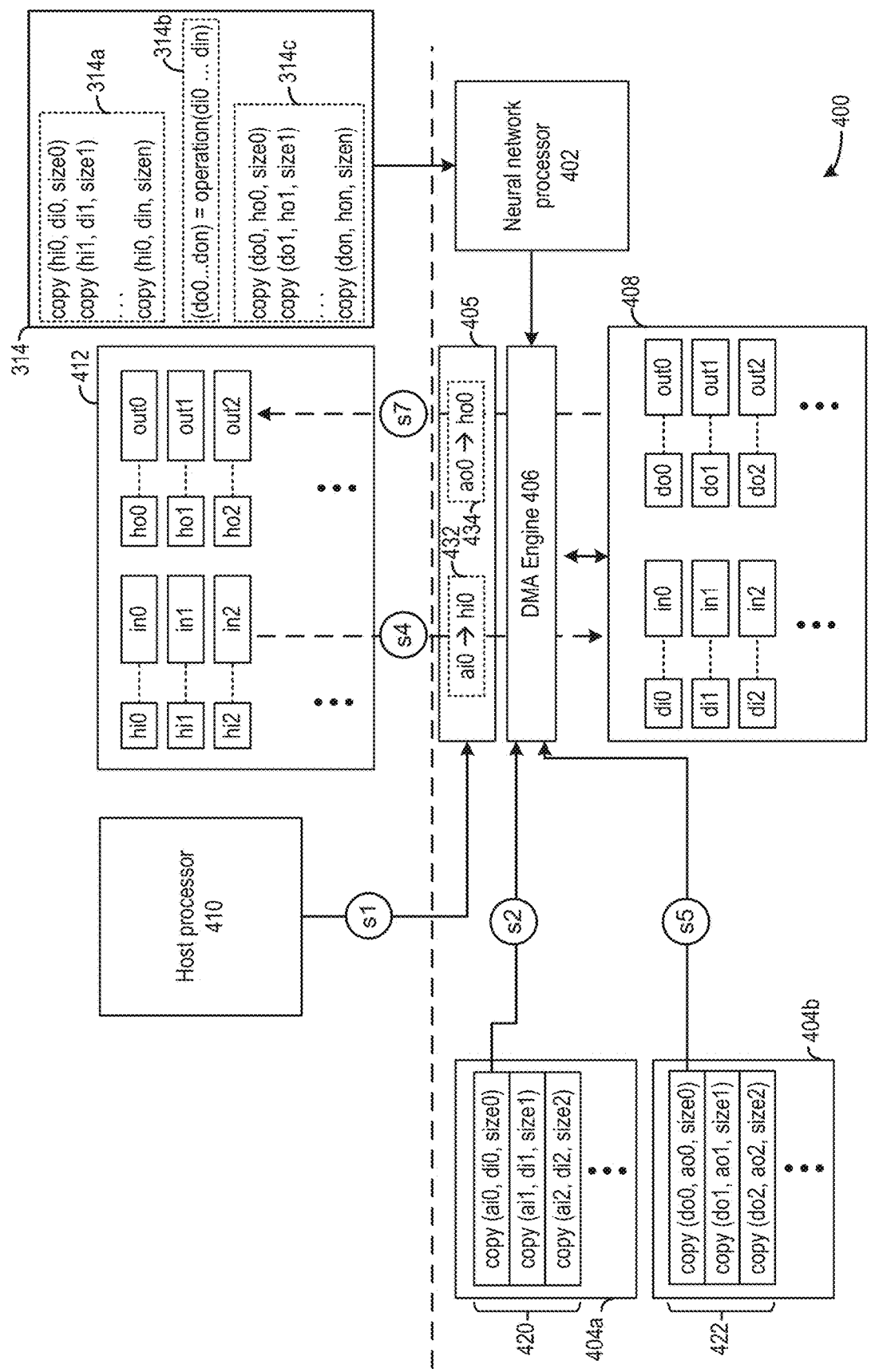
Figure 4C:
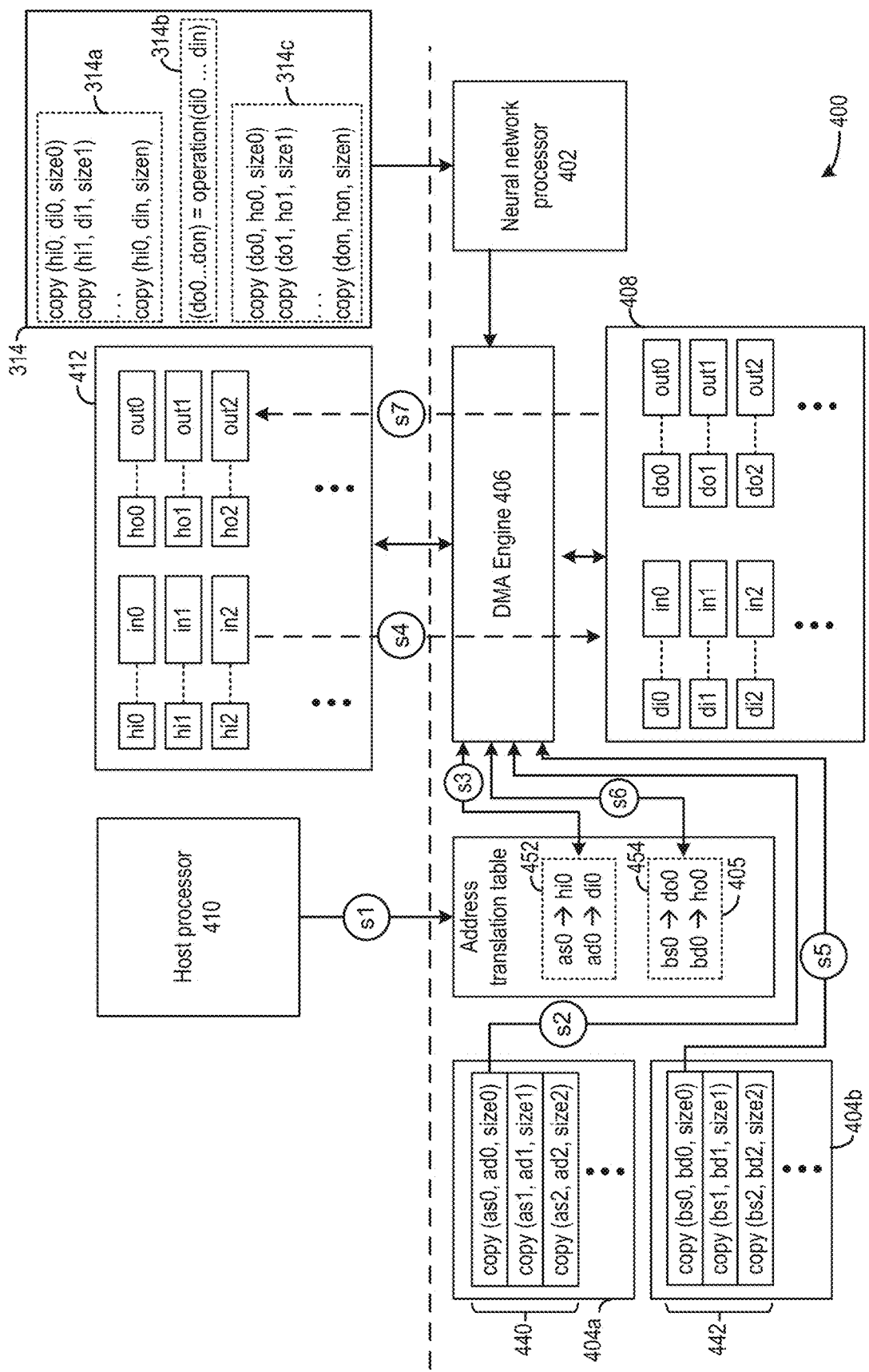

FIG. 4A-FIG. 4C illustrate additional examples of techniques to facilitate DMA operations between a host memory and a neural network hardware accelerator memory. As shown in FIG. 4A, a neural network hardware accelerator 400 may include a neural network processor 402, an input data DMA descriptor queue 404a, an output data DMA descriptor queue 404b, an address translation table 405, a DMA engine 406, and a local memory 408. Address translation table 405 can be part of DMA engine 406 or external to DMA engine 406 (e.g., being part of a data bus between DMA engine and the rest of the system). Neural network hardware accelerator 400 may be coupled with a host processor 410 and a host memory 412.

As shown in FIG. 4A, host processor 410 can dynamically allocate physical addresses in host memory 412 to support a neural network operation. For example, host processor 410 can allocate host input physical addresses (e.g., hi0, hi1, hi2, etc.) to store input data (e.g., in0, in1, in2, etc.) to the neural network operation, as well as host output physical addresses (e.g., ho0, ho1, ho2, etc.) to store output data (e.g., out0, out1, out2, etc.) of the neural network operation. The host input physical addresses and the host output physical addresses in host memory 512 can be allocated by, for example, an operating system executed on host processor 410. In addition, local memory 408 can include local input physical addresses (e.g., di0, di1, di2, etc.) to store the input data, as well as local output physical addresses (e.g., do0, do1, do2, etc.) to store the output data.

Both input data DMA descriptor queue 404a and output data DMA descriptor queue 404b can store, respectively, input data DMA descriptors 420 and output data DMA descriptors 422. Each of input data DMA descriptors 420 includes an input indirect address (e.g., ai0, ai1, ai2) as a source address, a destination physical address of local memory 408 (e.g., di0, di1, di2, etc.), and a programmable data transfer size field (size). The data transfer size field can be determined based on, for example, physical capabilities of DMA engine 406, input/output shapes, an optimal size for a neural network operation (e.g., convolution operation), etc. Moreover, each of output data DMA descriptors 422 includes a source physical address of local memory 408 (e.g., do0, do1, do2, etc.), an output indirect address (e.g., ao0, ao1, ao2, etc.) as a destination address, and a programmable data transfer size field (size). The indirect addresses in input data DMA descriptors 420 and output data DAM descriptors 422 can be mapped to any physical address in any memory, and are not associated with any particular memory prior to being mapped. The DMA descriptors can be statically stored in the descriptor queues 504a and 504b and can be reused for different DMA operations at different times. Both descriptor queues 504a and 504b can be implemented as ring buffers.

After the requester application stores the input data in the host memory and at the host input physical addresses, and allocates the host output physical addresses for storing the output data, the requester application can determine an address mapping 432 between the input indirect addresses (e.g., ai0, ai1, ai2, etc.) of input data DMA descriptors 420 and host input physical addresses (e.g., hi0, hi1, hi2) of host memory 412. The requester application can also determine an address mapping 434 between the output indirect addresses (e.g., ao0, ao1, ao2, etc.) of output data DMA descriptors 422 and host output physical addresses (e.g., ho0, ho1, ho2) of host memory 412. The requester application can program address translation 405 to store address mappings 432 and 434 in operations labelled "s1" in FIG. 4A.

After address translation table 405 has been programmed with address mapping data, neural network processor 402 can execute instructions 314 of a neural network operation, which can include instructions 314a for fetching input data from host memory 412 to local memory 408, instruction 314b for performing the neural network operation based on the input data from local memory 408 to generate output data and to store output data at local memory 408, and instructions 314c for fetching the output data from local memory 408 back to host memory 412, as described above.

As a result of executing instructions 314a, neural network processor 402 can control DMA engine 406 to fetch input data DMA descriptors 420 from input data DMA descriptor queue 504a based on, for example, a number of the memory operations included in instructions 314a. DMA engine 406 can fetch input data DMA descriptors 420 from input data DMA descriptor queue 504a, in operations labelled "s2". DMA engine 406 can then execute the input data DMA descriptors. As part of the execution, the DMA engine can use address translation table 405 to translate the input indirect addresses (e.g., ai0, ai1, ai2, etc.) into the corresponding host input physical addresses based on address mapping 432, in operations labelled "s3". DMA engine 406 (or a data bus that includes address translation table 405) can forward the host input physical addresses to host memory 412 to fetch the input data from host memory 412 to local input addresses of local memory 308, in operations labelled "s4" in FIG. 4A.

After executing instruction 314b and storing output data at local output addresses of local memory 308, neural network processor 302 can execute instructions 314c. As a result of executing instructions 314c, neural network processor 402 can control DMA engine 406 to fetch output data DMA descriptors 422 from output data DMA descriptor queue 404b based on, for example, a number of the DMA operations included in instructions 314c, in operations labelled "s5". DMA engine 406 can then use address translation table 405 to translate the output indirect addresses (e.g., ao0, ao1, ao2, etc.) into the corresponding host output physical addresses based on address mapping 434, in operations labelled "s6" in FIG. 4A. The translated host output physical addresses can then be provided to host memory 412 to fetch the output data from local output addresses of local memory 308 to the host input physical addresses of host memory 312, in operations labelled "s7" in FIG. 4A.

After the neural network operation completes, host processor 410 can store a new address mapping between indirect addresses and a new set of physical addresses (e.g., of host memory 412) into address translation table 405 for a subsequent neural network operation. The new address mapping may map the indirect addresses (e.g., ai0, ai1, ai2, ao0, ao1, ao2) to a new set of physical addresses which are different from those for the neural network operation that just completes. Neural network processor 402 can then execute a new set of instructions for the subsequent neural network operation and control DMA engine 406 to fetch input data DMA descriptors 420 and output data DMA descriptors 422 to address translation table 405 to translate the indirect addresses to physical addresses based on the new address mapping. DMA engine 406 can then perform DMA operations based on the new set of physical addresses to support the subsequent neural network operation.

In some examples, address translation table 405 can be external to DMA engine 406. For example, as shown in FIG. 4B, address translation table 405 can be interposed between DMA engine 406 and host memory 412. In the example of FIG. 4B, address translation table 405 can be part of a data bus between DMA engine 406 and host memory 412. In such example, DMA engine 406 can fetch input data DMA descriptors 420 and output data DMA descriptors 422 and issue a memory access request (e.g., a read request, a write request, etc.) to host memory 412 and local memory 408 based on the fetched data DMA descriptors. The read/write requests can include indirect addresses included in the data DMA descriptors. The read/write requests can be transmitted via the data bus, and the indirect addresses included in the read/write requests can be automatically translated by address translation table 405 to physical addresses, as part of the data transfer operations labelled "s4" and "s7", in the read/write requests. The data bus can then forward the read/write requests, including the translated physical addresses, to the memory (e.g., host memory 412, local memory 408, etc.) to perform DMA data transfer.

Although FIG. 4A and FIG. 4B illustrate that a data DMA descriptor (e.g., input data DMA descriptors 420, output data DMA descriptors 422, etc.) includes an indirect address as either a source address or a destination address, in some examples, a data DMA descriptor can include two indirect addresses as the source and destination addresses. FIG. 4C illustrates examples of input data DMA descriptors 440 and output data DMA descriptors 442 which have indirect addresses as both source and destination addresses. As shown in FIG. 4C, each input data DMA descriptors 440 includes a first source indirect address (e.g., as0, as1, as2) and a first destination indirect address (e.g., ad0, ad1, ad2). Moreover, each output data DMA descriptors 442 includes a second source indirect address (e.g., bs0, bs1, bs2) and a second destination indirect address (e.g., bd0, bd1, bd2).

Address translation table 405 can address mapping data to translate the indirect addresses of input data DMA descriptors 440 and output data DMA descriptors 442 to, for example, support DMA transfer of input data from host memory 412 to local memory 408, and from local memory 408 to host memory 412. For example, as shown in FIG. 4C, address translation table 405 can store an address mapping 452 which maps first source indirect addresses (e.g., as0, as1, as2) of input data DMA descriptors 440 to host input physical addresses (e.g., hi0, hi1, hi2) of host memory 412. Address mapping 452 also maps first destination indirect addresses (e.g., ad0, ad1, ad2) of input data DMA descriptors 440 to local input addresses (e.g., di0, di1, di2) of local memory 408. Moreover, address translation table 405 can also store an address mapping 454 which maps second source indirect addresses (e.g., bs0, bs1, bs2) of output data DMA descriptors 442 to local output addresses (e.g., do0, do1, do2) of local memory 408. Address mapping 454 also maps second destination indirect addresses (e.g., bd0, bd1, bd2) of output data DMA descriptors 442 to host output physical addresses (e.g., ho0, ho1, ho2) of host memory 412. In the example of FIG. 4C, the mapping between the local addresses and indirect addresses can be provided by host processor 410, neural network accelerator 400, or other devices that have knowledge of the allocation of the physical addresses of local memory 408.

Although FIG. 4A-FIG. 4C illustrate that the input and output data DMA descriptors are used to support DMA operations between host memory 412 and local memory 408, it is understood that input and output data DMA descriptors can also be used to support other types of DMA operations. For example, the input and output data DMA descriptors can be used to support DMA transfer of data between different physical addresses of host memory 412, between different physical addresses of local memory 408, etc., based on address mappings stored in address translation table 405.

Figure 4D:
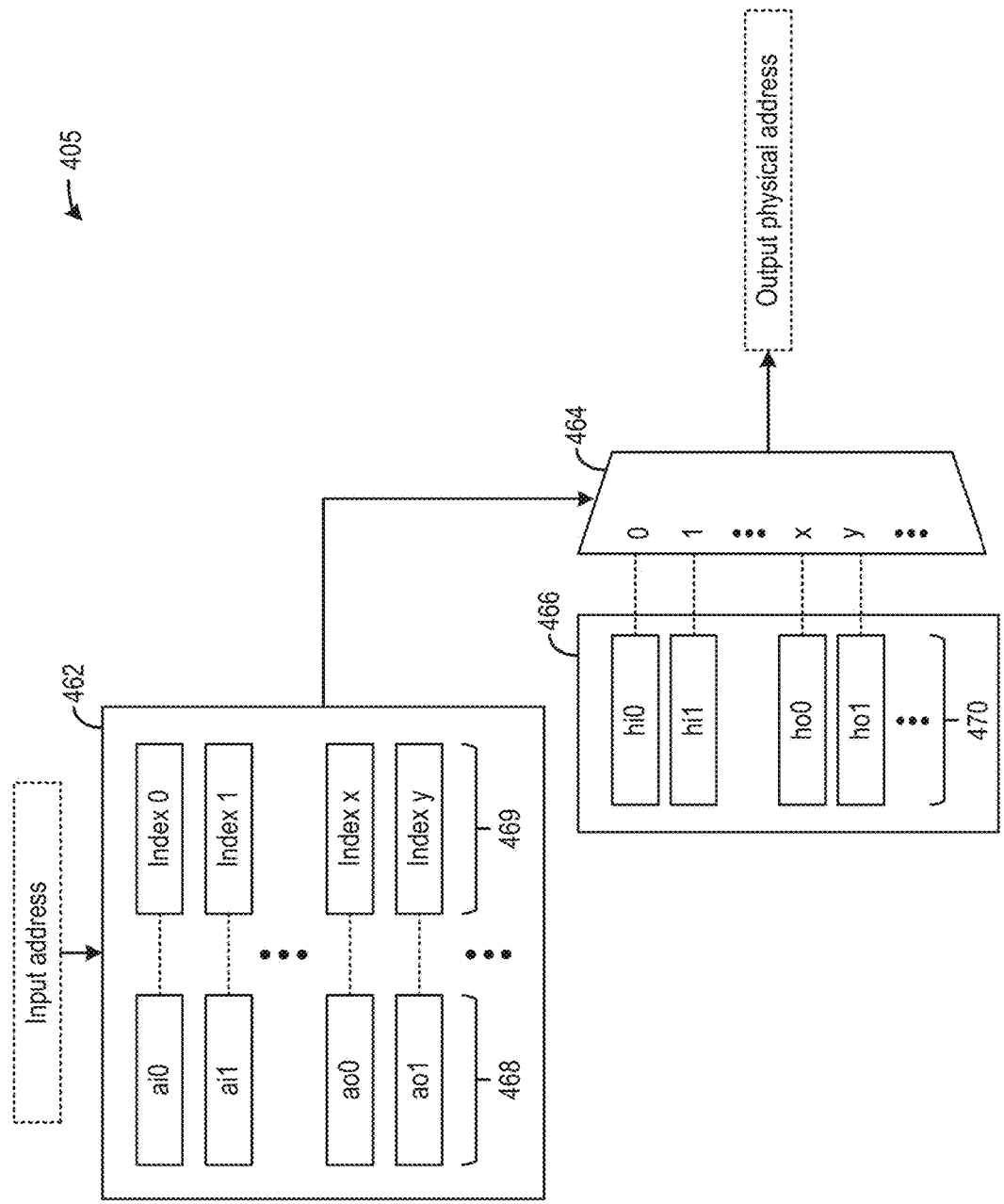

FIG. 4D illustrates example components of address translation table 405. As shown in FIG. 4D, address translation table 405 can be implemented as a content addressable memory (CAM) including a programmable mapping table 462, a multiplexor 464, and a bank of registers 466. Programmable mapping table can map between a set of indirect addresses 468 (e.g., ai0, ai1, ao0, ao1, etc.) to a set of indices 469. Programmable mapping table 462 can receive an input address, which can be an indirect address, search for a matching indirect address among indirect addresses 468, and output an index mapped to the matching indirect address. Multiplexor 464 receives a set of candidate output physical addresses 470 (e.g., hi0, hi1, ho0, ho1, etc.) stored in a bank of registers 466, and can output one of the candidate output physical addresses based on the index output by programmable mapping table 462. In a case in which no matching indirect address (e.g., the input is not an indirect address) is found, address translation table 405 can output the input address instead. The set of indirect addresses 468 and candidate output physical addresses 470 can be programmed based on address mapping information supplied by host processor 410.

With the techniques described above, a set of DMA descriptors can be reused for different neural network operations. As a result, a neural network processor needs not create and insert a large set of new DMA descriptors into a DMA descriptor queue for each neural network operation, especially in cases where the operations involve movement of a large quantity of input data and output data between the neural network hardware accelerator and the host memory (e.g., for autoregressive neural networks). All these can substantially improve the efficiency of the neural network operations.

Figure 5A:
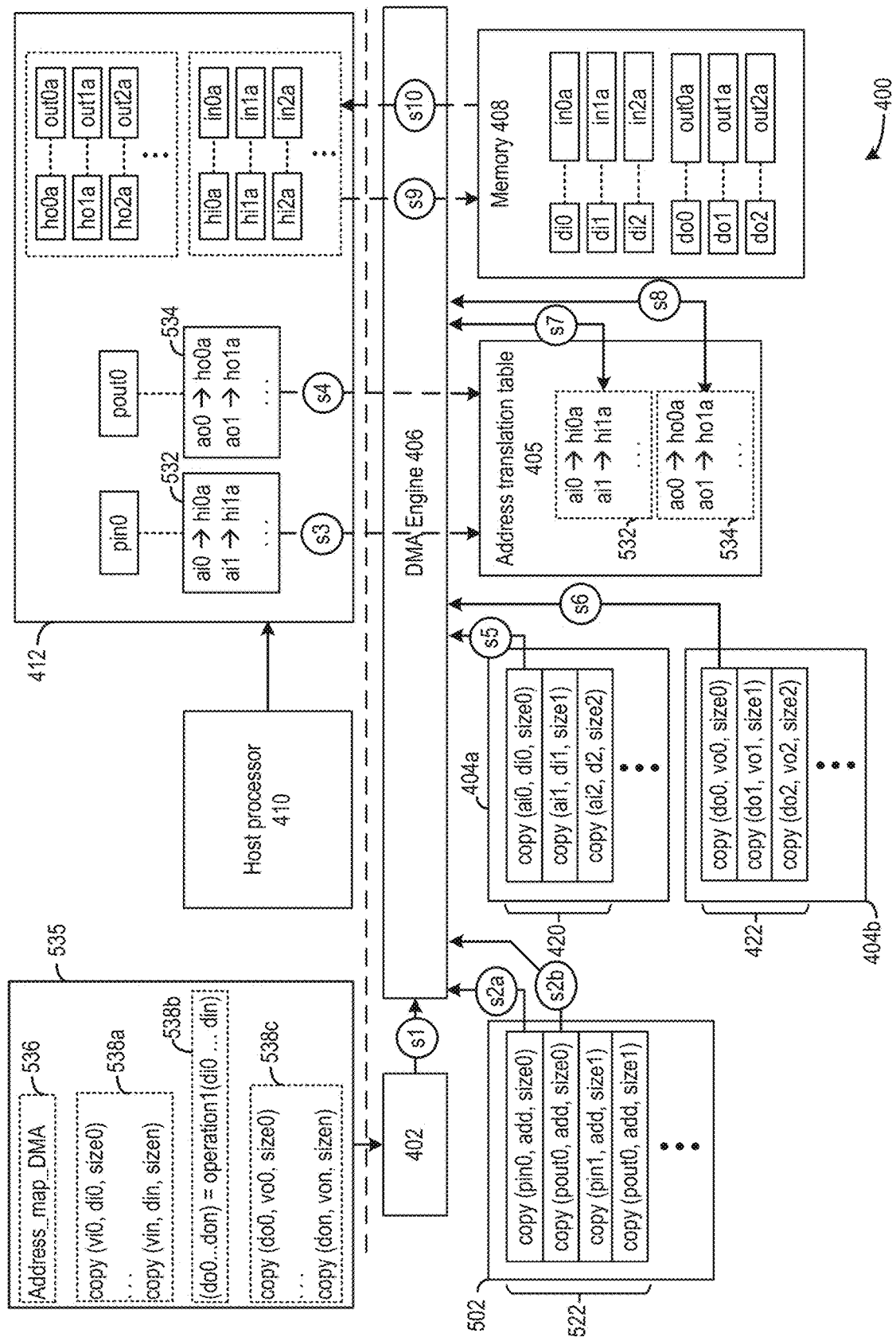
FIG. 5A and FIG. 5B illustrate another examples of neural network hardware accelerator and their DMA operations, according to certain aspects of the present disclosure.
Figure 5B:
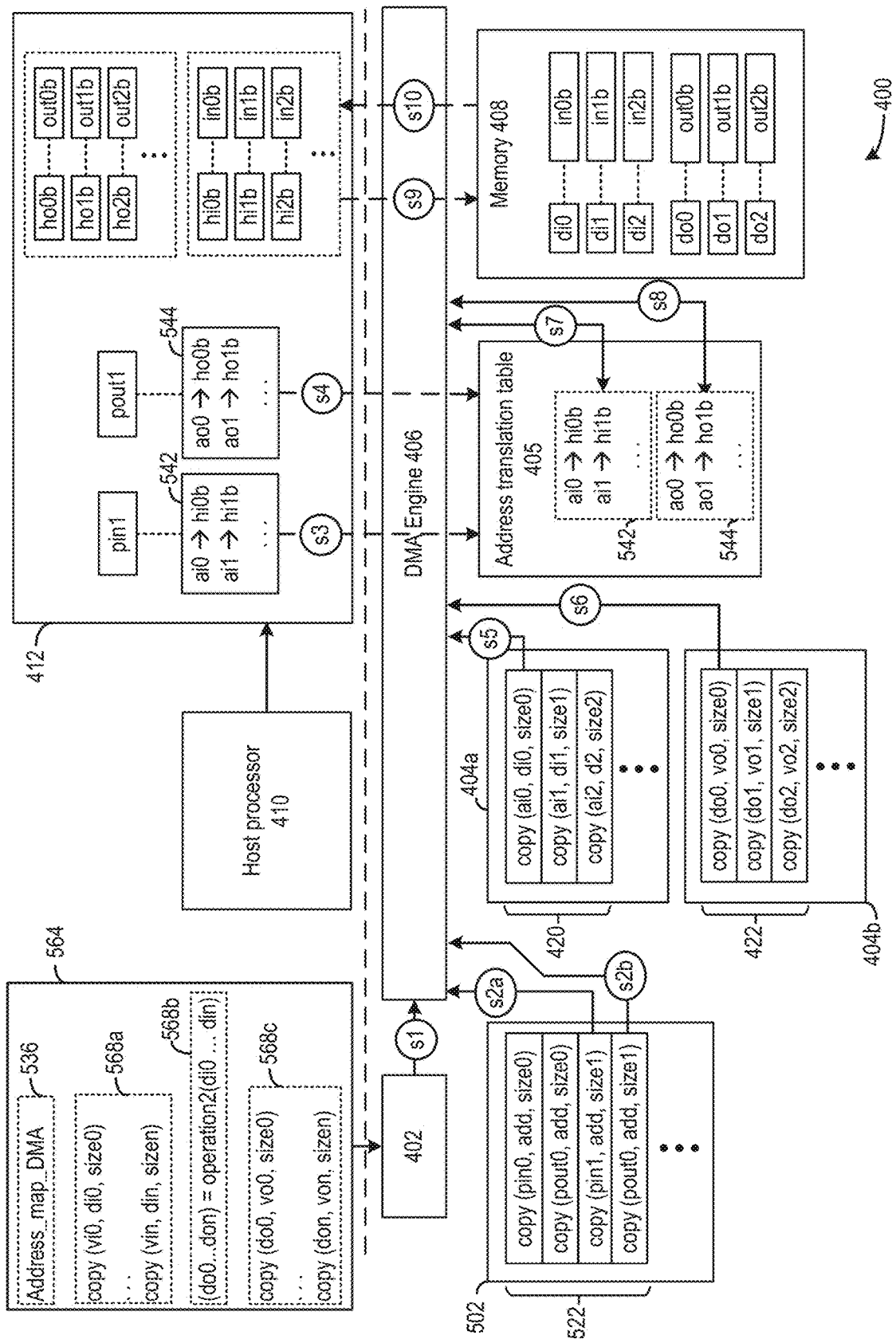

FIG. 5A and FIG. 5B illustrate additional examples of techniques to facilitate DMA operations between a host memory and a neural network hardware accelerator memory. Specifically, host processor 410 can transmit the address mapping data to address translation table 405 via a DMA operation. Host processor 410 can generate address mapping data for a neural network operation and store the address mapping data in host memory 412 (or in another memory). To transfer the address mapping data to address translation table 405 via a DMA operation, host processor 410 can generate an address mapping DMA descriptor, including a physical address of the address mapping data, in host memory 412, and transmit the address mapping DMA descriptor to neural network hardware accelerator 400, which can forward the DMA descriptor to DMA engine 406 to perform the transfer of address mapping data from host memory 412 to address translation table 405.

As shown in FIG. 4A, to support the DMA operations for transferring of address mapping data to address translation table 405, neural network hardware accelerator 400 may include, in addition to input data DMA descriptor queue 404a and output data DMA descriptor queue 404b, an address mapping DMA descriptor queue 502 that stores address mapping DMA descriptors 522. Address mapping DMA descriptors 522 can be transmitted by host processor 410.

Each of address mapping DMA descriptors 522 may include a physical address (e.g., pin0, pout0, pin1, pout1, etc.) of address mapping data between indirect addresses and physical addresses in host memory 412, as the source address of the address mapping DMA descriptor. Each address mapping DMA descriptor may also include an address of address translation table 405 ("add") as the destination address, as address translation table 405 is to receive and be programmed based on address mappings stored in host memory 412.

For example, referring to FIG. 5A, physical address pin0 can store address mapping 532 for translation of input indirect addresses (e.g., ai0, ai1, etc.) to a first set of host input physical addresses of host memory 412 (e.g., hi0a, hi1a, etc.), whereas physical address pout0 can store address mapping 534 for translation of output indirect addresses (e.g., ao0, ao1, etc.) to a first set of host output physical addresses of host memory 412 (e.g., ho0a, ho1a, etc.). The first set of host input physical addresses of host memory 412 can store a first set of input data (in0a, in1a, in2a, etc.), whereas the first set of host output physical addresses of host memory 412 can store a first set of output data (e.g., out0a, out1a, out2a, etc.). In addition, referring to FIG. 5B, physical address pin1 can store address mapping 542 for translation of input indirect addresses (e.g., ai0, ai1, etc.) to a second set of host input physical addresses of host memory 412 (e.g., hi0b, hi1b, etc.), whereas physical address pout1 can store address mapping 544 for translation of output indirect addresses (e.g., ao0, ao1, etc.) to a second set of host output physical addresses of host memory 412 (e.g., ho0b, ho1b, etc.). The second set of host input physical addresses of host memory 412 can store a second set of input data (in0b, in1b, in2b, etc.), whereas the first set of host output physical addresses of host memory 412 can store a first set of output data (e.g., out0b, out1b, out2b, etc.).

Although FIG. 5A illustrates that address mapping 532 and 534 are stored in different physical addresses (e.g., pin0 and pout0), it is understood that the address mappings 532 and 534 can be stored in one contiguous physical memory space referred by a physical address. In such a case, a single address mapping DMA descriptor can be used to transfer both address mappings 532 and 534 to address translation table 405.

To trigger DMA transfer of address mapping data from host memory 412 to address translation table 405, a set of instructions 535 to be executed by neural network processor 402 can include an instruction 536 ("address_map_DMA"), in addition to instructions 538a for copying a first set of input data (e.g., in0a, in1a, in2a, etc.) from host memory 412 to local memory 408, instructions 538b for a first neural network operation ("operation1"), and instructions 538c for copying a first set of output data (e.g., out0a, out1a, out2a, etc.) from local memory 408 back to host memory 412. As a result of executing instruction 536, neural network processor 402 can transmit a signal to DMA engine 406, in operations labelled "s1" in FIG. 5A. The signal can cause DMA engine 406 to fetch and execute a first input address mapping DMA descriptor and a first output address mapping DMA descriptor from address mapping DMA descriptor queue 502, in operations labelled "s2a" and "s2b" in FIG. 5A, prior to execution of instructions 538a and 538c for fetching of input and output data. The first input address mapping DMA descriptor includes the physical address pin0 as the source address, whereas the first output address mapping DMA descriptor includes the physical address pout0 as the source address.

Based on the fetched input and output address mapping DMA descriptors, DMA engine 406 can perform DMA operations to fetch data of address mappings 532 and 534 from, respectively, physical addresses pin0 and pout0 of host memory 412 to address translation table 405, in operations labelled "s3" and "s4" in FIG. 5A. In some examples, DMA engine 406 does not distinguish DMA descriptors fetched from a data DMA descriptor queue (e.g., queues 404a/404b) and from an address mapping DMA descriptor queue (e.g., queue 502). In such a case, DMA engine 406 may attempt to use address translation table 405 to translate the physical addresses (pin0, pout0, etc.) included in the address mapping DMA descriptors. Address translation table 405 may report that the physical addresses are not found in the address mappings, and the physical addresses in the address mapping DMA descriptors may remain un-translated. DMA engine 406 can then perform DMA operations based on the original physical addresses included in the address mapping DMA descriptors to fetch address mappings 532 and 534.

After address translation 405 stores address mappings 532 and 534, neural network processor 402 can control DMA engine 406 to fetch input data DMA descriptors 420 from input data DMA descriptor queue 404a, and to fetch output data DMA descriptors 422 from output data DMA descriptor queue 404b, in operations labelled "s5" and "s6" in FIG. 5A. DMA engine 406 can then translate the indirect addresses in the data DMA descriptors into the first set of host input and output physical addresses of host memory 412 (e.g., hi0a, hi1a, ho0a, ho1a, etc.) via address translation table and based on address mappings 532 and 534, in operations labelled "s7" and "s8" in FIG. 5A. DMA engine 406 can then perform the DMA operations of the first set of input data and output data (e.g., in0a, in1a, out0a, out1a, etc.) between host memory 412 and local memory 408 based on the physical addresses in operations labelled "s9" and "s10" in FIG. 5A.

Referring to FIG. 5B, after neural network processor 402 completes execution of instructions 535, neural network processor 402 can execute a new set of instructions 564 for a second neural network operation ("operation2"). The new set of instructions can include another "address_map_DMA" instruction 536, in addition to instructions 568a for copying a second set of input data (e.g., in0b, in1b, in2b, etc.) from host memory 412 to local memory 408, instructions 538b for the second neural network operation ("operation2"), and instructions 568c for copying a second set of output data (e.g., out0b, out1b, out2b, etc.) from local memory 408 back to host memory 412.

As a result of executing instruction 536 of instructions 564, neural network processor 402 can transmit a signal to DMA engine 406, in operations labelled "s1" in FIG. 5B. The signal can cause DMA engine 406 to fetch and execute a second input address mapping DMA descriptor and a second output address mapping DMA descriptor from address mapping DMA descriptor queue 502, in operations labelled "s2a" and "s2b" in FIG. 5B, prior to execution of instructions 538a and 538c for fetching of input and output data. The second input address mapping DMA descriptor includes the physical address pin1 as the source address, whereas the second output address mapping DMA descriptor includes the physical address pout1 as the source address.

Based on the fetched input and output address mapping DMA descriptors, DMA engine 406 can perform DMA operations to fetch data of address mappings 542 and 544 from, respectively, physical addresses pin1 and pout1 of host memory 412 to address translation table 405, in operations labelled "s3" and "s4" in FIG. 5B. After address translation 405 stores address mappings 542 and 544, neural network processor 402 can control DMA engine 406 to fetch input data DMA descriptors 420 from input data DMA descriptor queue 404a, and to fetch output data DMA descriptors 422 from output data DMA descriptor queue 404b, in operations labelled "s5" and "s6" in FIG. 5B. DMA engine 406 can then translate the indirect addresses in the data DMA descriptors into a second set of host input and output physical addresses of host memory 412 (e.g., ho0b, ho1b, hi0b, hi1b, etc.) via address translation table and based on address mappings 532 and 534, in operations labelled "s7" and "s8" in FIG. 5B. DMA engine 406 can then perform the DMA operations of the second set of input data and output data (e.g., in0b, in1b, out0b, out1b, etc.) between host memory 412 and local memory 408 based on the physical addresses in operations labelled "s9" and "s10" in FIG. 5B.

Figure 6:
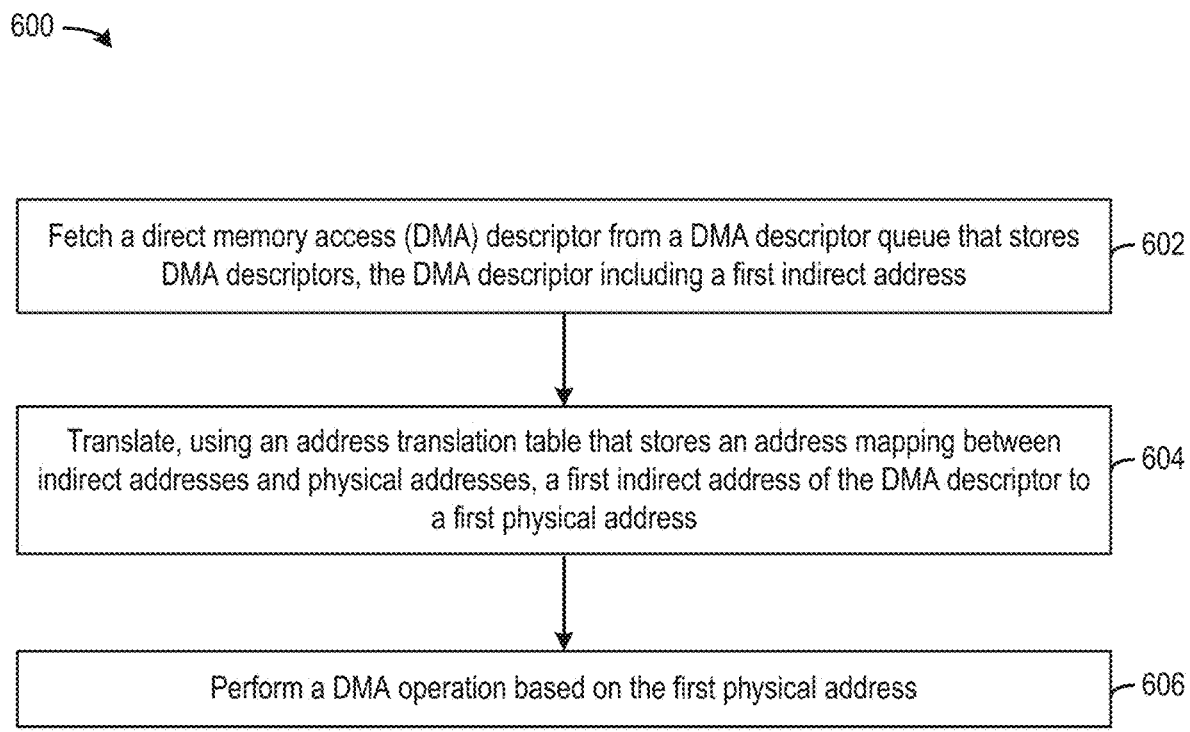
FIG. 6 illustrates a flowchart of an example method of performing a DMA operation, according to certain aspects of the present disclosure.

FIG. 6 illustrates the flowchart of a method 600 of performing a DMA operation. Method 600 can be performed by, for example, various components of neural network hardware accelerator 400 of FIG. 4A-FIG. 5B. As described above, a neural network hardware accelerator 400 may include neural network processor 402, input data DMA descriptor queue 404a, output data DMA descriptor queue 404b, address translation table 405, DMA engine 406, and local memory 408, as shown in FIG. 4A. In some examples, neural network hardware accelerator 400 may further include input address mapping DMA descriptor queue 502a and output address mapping DMA descriptor queue 502b, as shown in FIG. 5A. Neural network hardware accelerator 400 may be coupled with host processor 410 and host memory 412.

In step 602, DMA engine 406 may fetch a direct memory access (DMA) descriptor from a DMA descriptor queue that stores DMA descriptors, the DMA descriptor including a first indirect address.

Specifically, the DMA descriptor may include, for example, one of input data DMA descriptors 420 or output data DMA descriptors 422 of FIG. 4A, one of input data DMA descriptors 440 or output data DMA descriptors 442 of FIG. 4B, etc. The data DMA descriptors may be statically stored in a data DMA descriptor queue, such as input data DMA descriptor queue 404a, output data DMA descriptor queue 404b, etc. Each data DMA descriptor may include at least an indirect address which can be mapped to different physical addresses at different memory devices (e.g., local memory 408, host memory 412, or other memory devices), and is not associated with a particular memory. The indirect address can be a source address of a data DMA descriptor (as in input data DMA descriptors 420), a destination address of a data DMA descriptor (as in output data DMA descriptors 422), or both the source and destination addresses of the data DMA descriptor (as in input data DMA descriptors 440 and output data DMA descriptors 442 of FIG. 4B).

Neural network processor 402 can control DMA engine 406 to fetch the DMA descriptor to support a neural network operation. For example, prior to performing the neural network operation, neural network processor 402 can control DMA engine 406 to fetch input data DMA descriptors to perform DMA operations for fetching input data to the neural network operation from host memory 412 to local memory 408. After completing the neural network operation and storing the output data at local memory 408, neural network processor 402 can control DMA engine 406 to fetch output data DMA descriptors to perform DMA operations for fetching the output data from local memory 408 back to host memory 412.

In step 604, DMA engine 406 translates, using address translation table 405 which stores an address mapping that maps indirect addresses to physical addresses, the first indirect address to a first physical address. The address mapping can be provided by host processor 410 after allocating physical addresses in host memory 412 for storing input data and output data of a neural network operation, and the address mapping can be stored in address translation table 405, which can include a content addressable memory (CAM) as shown in FIG. 4C.

In some examples, as illustrated in FIG. 5A and FIG. 5B, the address mapping data can be transferred to address translation table 405 via DMA operations. Host processor 410 can store address mapping data (e.g., address mapping 532, 534, 542, 544, etc.) at pre-determined physical addresses (e.g., pin0, pout0, pin1, pout1, etc.). Host processor 410 can generate address mapping DMA descriptors 522 each including a physical address where the address mapping data are stored, and store the address mapping DMA descriptor queue 502. To support a first neural network operation, neural network processor 402 can execute a pre-determined instruction (e.g., instruction 536) which triggers the neural network processor to send a signal to DMA engine 406 to fetch an input address mapping DMA descriptor and an output address mapping DMA descriptor, and perform DMA operations to fetch a first set of address mapping data (e.g., address mappings 532 and 534) from host memory 412 to address translation table 405 to provide translation of indirect addresses of data DMA descriptors.

After the first neural network operation completes, neural network processor 402 can execute another one of the pre-determined instructions to fetch another input address mapping DMA descriptor and another output address mapping DMA descriptor, and perform DMA operations to fetch a second set of address mapping data (e.g., address mappings 542 and 544) from host memory 412 to address translation table 405, to provide indirect address translation for a second neural network operation.

In step 606, DMA engine 406 can perform a DMA operation based on the first physical address. The DMA operation may include, for example, fetching input data from the first physical address of host memory 412 to local memory 408, fetching output data from local memory 408 to the first physical address of host memory 412, fetching data between different physical addresses of the same memory device, etc.

Figure 7:
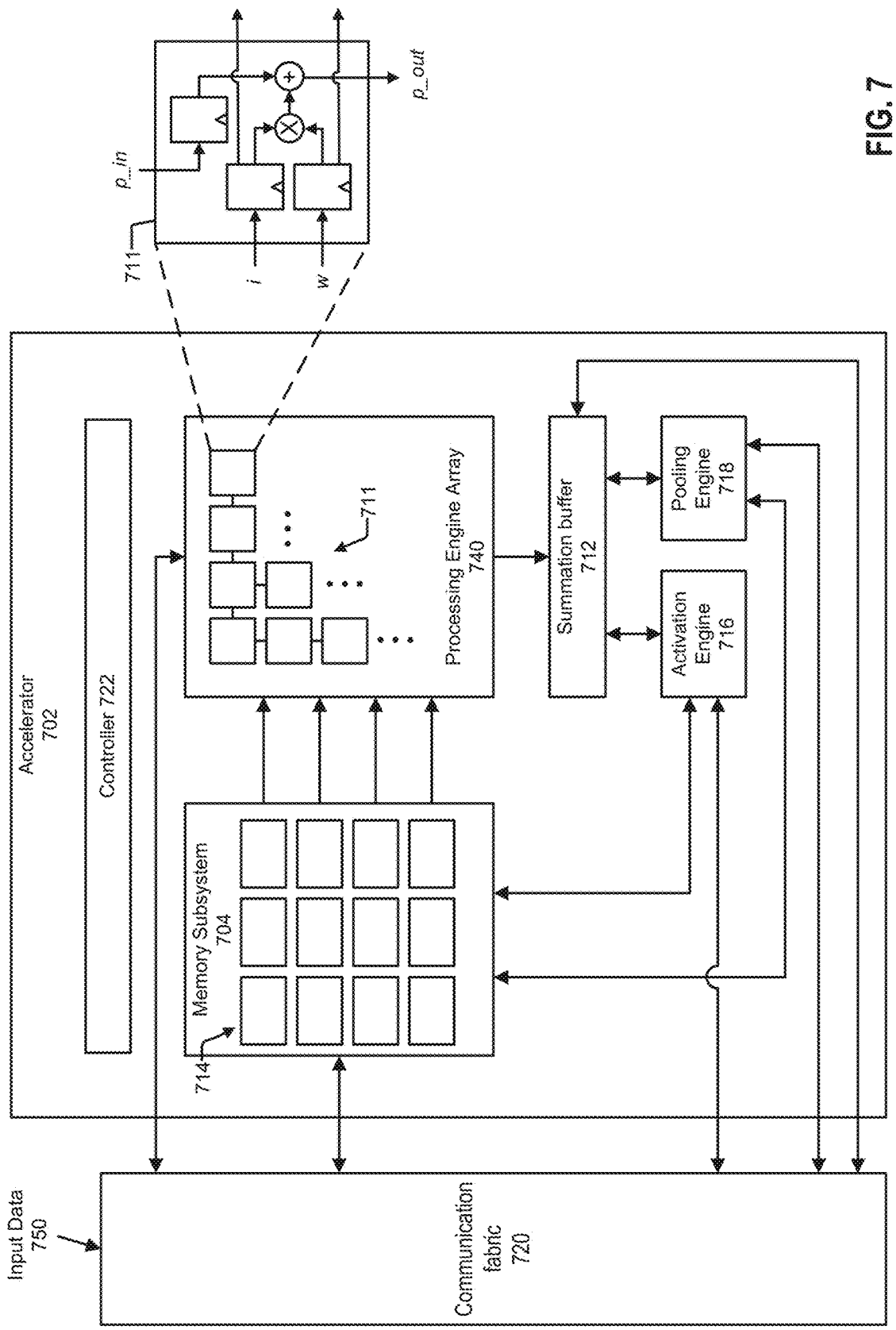
FIG. 7 illustrates an example of an integrated circuit that can support the example neural network operations and DMA operations of FIGS. 3-6.

FIG. 7 is a block diagram illustrating an example of an integrated circuit device that can include a neural network hardware accelerator, such as neural network hardware accelerators 300 and 400. The example of FIG. 7 illustrates an accelerator 702. In various examples, the accelerator 702, for a set of input data (e.g., input data 750), can execute computations using a processing engine array 710, an activation engine 716, and/or a pooling engine 718. In some examples, the example accelerator 702 may be an integrated circuit component of a processor, such as a neural network processor. The processor may have other integrated circuit components, including additional accelerator engines.

In various implementations, the memory subsystem 704 can include multiple memory banks 714. In these implementations, each memory bank 714 can be independently accessible, meaning that the read of one memory bank is not dependent on the read of another memory bank. Similarly, writing to one memory bank does not affect or limit writing to a different memory bank. In some cases, each memory bank can be read and written at the same time. Various techniques can be used to have independently accessible memory banks 714. For example, each memory bank can be a physically separate memory component that has an address space that is separate and independent of the address spaces of each other memory bank. In this example, each memory bank may have at least one read channel and may have at least one separate write channel that can be used at the same time. In these examples, the memory subsystem 704 can permit simultaneous access to the read or write channels of multiple memory banks. As another example, the memory subsystem 704 can include arbitration logic such that arbitration between, for example, the outputs of multiple memory banks 714 can result in more than one memory bank's output being used. In these and other examples, though globally managed by the memory subsystem 704, each memory bank can be operated independently of any other.

Having the memory banks 714 be independently accessible can increase the efficiency of the accelerator 702. For example, values can be simultaneously read and provided to each row of the processing engine array 710, so that the entire processing engine array 710 can be in use in one clock cycle. As another example, the memory banks 714 can be read at the same time that results computed by the processing engine array 710 are written to the memory subsystem 704. In contrast, a single memory may be able to service only one read or write at a time. With a single memory, multiple clock cycles can be required, for example, to read input data for each row of the processing engine array 710 before the processing engine array 710 can be started.

In various implementations, the memory subsystem 704 can be configured to simultaneously service multiple clients, including the processing engine array 710, the activation engine 716, the pooling engine 718, and any external clients that access the memory subsystem 704 over a communication fabric 720. In some implementations, being able to service multiple clients can mean that the memory subsystem 704 has at least as many memory banks as there are clients. In some cases, each row of the processing engine array 710 can count as a separate client. In some cases, each column of the processing engine array 710 can output a result, such that each column can count as a separate write client. In some cases, output from the processing engine array 710 can be written into the memory banks 714 that can then subsequently provide input data for the processing engine array 710. As another example, the activation engine 716 and the pooling engine 718 can include multiple execution channels, each of which can be separate memory clients. The memory banks 714 can be implemented, for example, using static random access memory (SRAM).

In various implementations, the memory subsystem 704 can include control logic. The control logic can, for example, keep track of the address spaces of each of the memory banks 714, identify memory banks 714 to read from or write to, and/or move data between the memory banks 714. In some implementations, memory banks 714 can be hardwired to particular clients. For example, a set of memory banks 714 can be hardwired to provide values to the rows of the processing engine array 710, with one memory bank servicing each row. As another example, a set of memory banks can be hard wired to receive values from columns of the processing engine array 710, with one memory bank receiving data for each column.

The processing engine array 710 is the computation matrix of the example accelerator 702. The processing engine array 710 can, for example, execute parallel integration, convolution, correlation, and/or matrix multiplication, among other things. The processing engine array 710 includes multiple processing engines 711, arranged in rows and columns, such that results output by one processing engine 711 can be input directly into another processing engine 711. Processing engines 711 that are not on the outside edges of the processing engine array 710 thus can receive data to operate on from other processing engines 711, rather than from the memory subsystem 704.

In various examples, the processing engine array 710 uses systolic execution, in which data arrives at each processing engine 711 from different directions at regular intervals. In some examples, input data can flow into the processing engine array 710 from the left and weight values can be loaded at the top. In some examples, weights and input data can flow from the left and partial sums can flow from top to bottom. In these and other examples, a multiply-and-accumulate operation moves through the processing engine array 710 as a diagonal wave front, with data moving to the right and down across the array. Control signals can be input at the left at the same time as weights, and can flow across and down along with the computation.

In various implementations, the number of columns in the processing engine array 710 determines the computational capacity of the processing engine array 710, and the number of rows determines the required memory bandwidth for achieving maximum utilization of the processing engine array 710. The processing engine array 710 can have, for example, 64 columns and 428 rows, or some other number of columns and rows.

An example of a processing engine 711 is illustrated in FIG. 7 in an inset diagram. As illustrated by this example, a processing engine 711 can include a multiplier-accumulator circuit. Inputs from the left can include, for example, input data i and a weight value w, where the input data is a value taken from either a set of input data or a set of intermediate results, and the weight value is from a set of weight values that connect one layer of the neural network to the next. A set of input data can be, for example, an image being submitted for identification or object recognition, an audio clip being provided for speech recognition, a string of text for natural language processing or machine translation, or the current state of a game requiring analysis to determine a next move, among other things. In some examples, the input data and the weight value are output to the right, for input to the next processing engine 711.

In the illustrated example, an input from above can include a partial sum, p_in, provided either from another processing engine 711 or from a previous round of computation by the processing engine array 710. When starting a computation for a new set of input data, the top row of the processing engine array 710 can receive a fixed value for p_in, such as zero. As illustrated by this example, i and w are multiplied together and the result is summed with p_in to produce a new partial sum, p_out, which can be input into another processing engine 711. Various other implementations of the processing engine 711 are possible.

Outputs from the last row in the processing engine array 710 can be temporarily stored in the results buffer 712. The results can be intermediate results, which can be written to the memory banks 714 to be provided to the processing engine array 710 for additional computation. Alternatively, the results can be final results, which, once written to the memory banks 714, can be read from the memory subsystem 704 over the communication fabric 720, to be output by the system.

In some implementations, the accelerator 702 includes an activation engine 716. In these implementations, the activation engine 716 can combine the results from the processing engine array 710 into one or more output activations. For example, for a convolutional neural network, convolutions from multiple channels can be summed to produce an output activation for a single channel. In other examples, accumulating results from one or more columns in the processing engine array 710 may be needed to produce an output activation for a single node in the neural network. In some examples, activation engine 716 can be bypassed.

In various examples, the activation engine 716 can include multiple separate execution channels. In these examples, the execution channels can correspond to the columns of the processing engine array 710, and can perform an operation on the outputs of a column, the result of which can be stored in the memory subsystem 704. In these examples, the activation engine 716 may be able to perform between 1 and i parallel computations, where n is equal to the number of columns in the processing engine array 710. In some cases, one or more of the computations can be performed simultaneously. Examples of computations that each execution channel can perform include exponentials, squares, square roots, identities, binary steps, bipolar steps, sigmoidals, and ramps, among other examples.

In some implementations, the accelerator 702 can include a pooling engine 718. Pooling is the combining of outputs of the columns of the processing engine array 710. Combining can include, for example, computing a maximum value, a minimum value, an average value, a median value, a summation, a multiplication, or another logical or mathematical combination. In various examples, the pooling engine 718 can include multiple execution channels that can operate on values from corresponding columns of the processing engine array 710. In these examples, the pooling engine 718 may be able to perform between 1 and n parallel computations, where n is equal to the number of columns in the processing engine array 710. In various examples, execution channels of the pooling engine 718 can operate in parallel and/or simultaneously. In some examples, the pooling engine 718 can be bypassed.

Herein, the activation engine 716 and the pooling engine 718 may be referred to collectively as execution engines. The processing engine array 710 is another example of an execution engine. Another example of an execution engine is a Direct Memory Access (DMA) engine, which may be located outside the accelerator 702.

Input data 750 can arrive over the communication fabric 720. The communication fabric 720 can connect the accelerator 702 to other components of a processor, such as a DMA engine that can obtain input data 750 from an Input/Output (I/O) device, a storage drive, or a network interface. The input data 750 can be, for example, one-dimensional data, such as a character string or numerical sequence, or two-dimensional data, such as an array of pixel values for an image or frequency and amplitude values over time for an audio signal. In some examples, the input data 750 can be three-dimensional, as may be the case with, for example, the situational information used by a self-driving car or virtual reality data. In some implementations, the memory subsystem 704 can include a separate buffer for the input data 750. In some implementations, the input data 750 can be stored in the memory banks 714 when the accelerator 702 receives the input data 750.

In some examples, the accelerator 702 can implement a neural network processing engine. In these examples, the accelerator 702, for a set of input data 750, can execute a neural network to perform a task for which the neural network was trained. Executing a neural network on a set of input data can be referred to as inference or performing inference.

The weights for the neural network can be stored in the memory subsystem 704, along with input data 750 on which the neural network will operate. The neural network can also include instructions, which can program the processing engine array 710 to perform various computations on the weights and the input data. The instructions can also be stored in the memory subsystem 704, in the memory banks 714 or in a separate instruction buffer. The processing engine array 710 can output intermediate results, which represent the outputs of individual layers of the neural network. In some cases, the activation engine 716 and/or pooling engine 718 may be enabled for computations called for by certain layers of the neural network. The accelerator 702 can store the intermediate results in the memory subsystem 704 for inputting into the processing engine array 710 to compute results for the next layer of the neural network. The processing engine array 710 can further output final results from a last layer of the neural network. The final results can be stored in the memory subsystem 704 and then be copied out to host processor memory or to another location.

Figure 8:
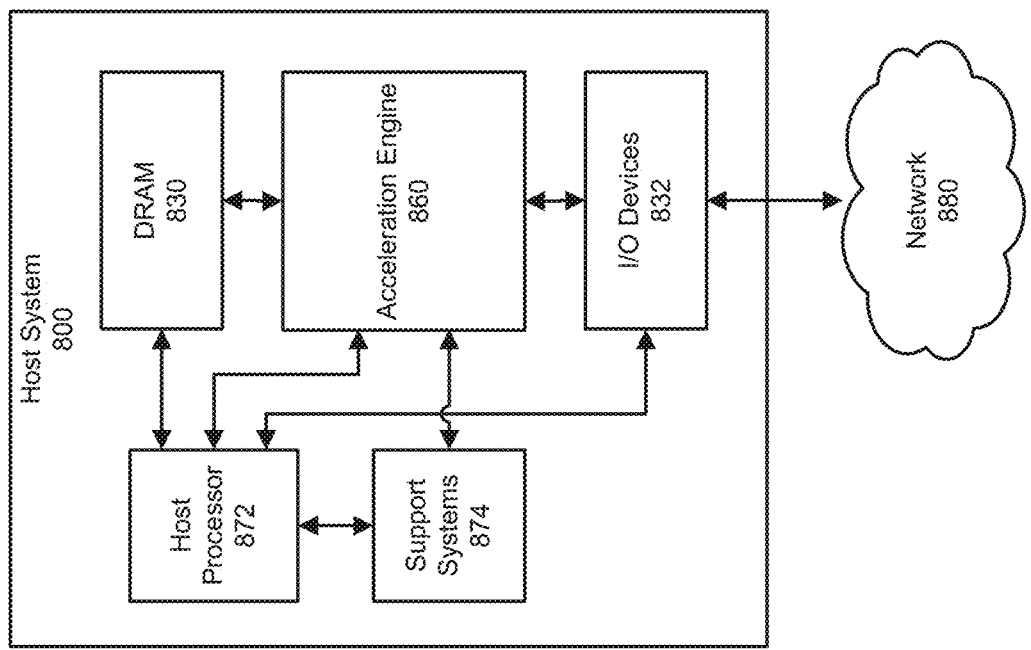
FIG. 8 illustrates an example of a host system that can support the example neural network operations and DMA operations of FIGS. 3-6.

FIG. 8 includes a block diagram that illustrates an example of a host system 800 in which an acceleration engine 860 can be used. The acceleration engine 860 of FIG. 8 is an example of a device that can include one or more accelerators such as is illustrated in FIG. 7. The example host system 800 of FIG. 8 includes the acceleration engine 860, a host processor 872, DRAM 830 or processor memory, I/O devices 832, and support systems 874. In various implementations, the host system 800 can include other hardware that is not illustrated here.

The host processor 872 is a general purpose integrated circuit that is capable of executing program instructions. In some examples, the host processor 872 can include multiple processing cores. A multi-core processor may include multiple processing units within the same processor. In some examples, the host system 800 can include more than one host processor 872. In some examples, the host processor 872 and the acceleration engine 860 can be one chip, such as, one or more integrated circuits within the same package. Host processor 872 can perform the operations, such as memory management, programming of DMA descriptors, etc., as host processor 410.

In various examples, the host processor 872 can communicate with other components in the host system 800 over one or more communication channels. For example, the host system 800 can include a host processor bus, which the host processor 872 can use to communicate with the DRAM 830, for example. As another example, the host system 800 can include an I/O bus, such as a PCI-based bus, over which the host processor 872 can communicate with the acceleration engine 860 and/or the I/O devices 832, for example. In various examples, the host system 800 can, alternatively or additionally, include other communication channels or busses, such as serial busses, power management busses, storage device busses, and so on.

In some examples, software programs executing on the host processor 872 can receive or generate input for processing by the acceleration engine 860. In some examples, the programs can select an appropriate neural network to execute for a given input. For example, a program may be for language translation, and can select one or more neural networks capable of speech recognition and/or machine translation. In these and other examples, the programs can configure the acceleration engine 860 with the neural network to execute, and/or can select a neural network processing engine on the acceleration engine 860 that has previously been configured to execute the desired neural network. In some examples, once the acceleration engine 860 has started an inference on input data, the host processor 872 can manage the movement of data (such as weights, instructions, intermediate results, results of conditional layers, and/or final results) into or out of the acceleration engine 860.

In some examples, a software program that is using the acceleration engine 860 to conduct an inference can read the result from a conditional layer from the acceleration engine 860 and/or from a storage location, such as in DRAM 830. In these examples, the program can determine what action the neural network should take next. For example, the program can determine to terminate the inference. As another example, the program can determine to change the direction of the inference, which can be translated by lower level code and/or the neural network processor to a next layer to execute. In these and other examples, the execution flow of the neural network can be coordinated by software.

The DRAM 830 is memory that is used by the host processor 872 for storage of program code that the host processor 872 is in the process of executing, as well as values that are being operated on. In some examples, the data for a neural network (e.g., weight values, instructions, and other data) can be all or partially stored in the DRAM 830. DRAM is a common term for processor memory, and though DRAM is volatile memory, processor memory can be volatile and/or non-volatile. Though not illustrated here, the host system 800 can include other volatile and non-volatile memories for other purposes. For example, the host system 800 can include a Read-Only Memory (ROM) that stores boot code for booting the host system 800 at power on, and/or Basic Input/Output System (BIOS) code.

Though not illustrated here, the DRAM 830 can store instructions for various programs, which can be loaded into and be executed by the host processor 872. For example, the DRAM 830 can be storing instructions for an operating system, one or more data stores, one or more application programs, one or more drivers, and/or services for implementing the features disclosed herein.

The operating system can manage and orchestrate the overall operation of the host system 800, such as scheduling tasks, executing applications, and/or controller peripheral devices, among other operations. In some examples, a host system 800 may host one or more virtual machines. In these examples, each virtual machine may be configured to execute its own operating system. Examples of operating systems include Unix, Linux, Windows, Mac OS, iOS, Android, and the like. The operating system may, alternatively or additionally, be a proprietary operating system.

The data stores can include permanent or transitory data used and/or operated on by the operating system, application programs, or drivers. Examples of such data include web pages, video data, audio data, images, user data, and so on. The information in the data stores may, in some examples, be provided over the network(s) to user devices. In some cases, the data stores may additionally or alternatively include stored application programs and/or drivers. Alternatively or additionally, the data stores may store standard and/or proprietary software libraries, and/or standard and/or proprietary application user interface (API) libraries. Information stored in the data stores may be machine-readable object code, source code, interpreted code, or intermediate code.

The drivers can include programs that provide communication between components in the host system 800. For example, some drivers can provide communication between the operating system and peripheral devices or I/O devices 832. Alternatively or additionally, some drivers may provide communication between application programs and the operating system, and/or application programs and peripheral devices accessible to the host system 800. In many cases, the drivers can include drivers that provide well-understood functionality (e.g., printer drivers, display drivers, hard disk drivers, Solid State Device drivers, etc.). In other cases, the drivers may provide proprietary or specialized functionality.

The I/O devices 832 can include hardware for connecting to user input and output devices, such as keyboards, mice, pens, tablets, voice input devices, touch input devices, displays or monitors, speakers, and printers, among other devices. The I/O devices 832 can also include storage drives and/or network interfaces for connecting to a network 880. For example, the host system 800 can use a network interface to communicate with storage devices, user terminals, other computing devices or servers, and/or other networks, among various examples.

In various examples, one or more of the I/O devices 832 can be storage devices. In these examples, the storage devices include non-volatile memory and can store program instructions and/or data. Examples of storage devices include magnetic storage, optical disks, solid state disks, flash memory, and/or tape storage, among others. The storage device can be housed in the same chassis as the host system 800 or may be in an external enclosure. A storage device can be fixed (e.g., attached by screws) or removable (e.g., having a physical release mechanism and possibly a hot-plug mechanism).

Storage devices, the DRAM 830, and any other memory component in the host system 800 are examples of computer-readable storage media. Computer-readable storage media are physical mediums that are capable of storing data in a format that can be read by a device such as the host processor 872. Computer-readable storage media can be non-transitory. Non-transitory computer-readable media can retain the data stored thereon when no power is applied to the media. Examples of non-transitory computer-readable media include ROM devices, magnetic disks, magnetic tape, optical disks, flash devices, and solid state drives, among others. As used herein, computer-readable storage media does not include computer-readable communication media.

In various examples, the data stored on computer-readable storage media can include program instructions, data structures, program modules, libraries, other software program components, and/or other data that can be transmitted within a data signal, such as a carrier wave or other transmission. The computer-readable storage media can, additionally or alternatively, include documents, images, video, audio, and other data that can be operated on or manipulated through the use of a software program.

In various examples, one or more of the I/O devices 832 can be PCI-based devices. In these examples, a PCI-based I/O device includes a PCI interface for communicating with the host system 800. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices, such as a local peripheral device, to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe.

A PCI-based device can include one or more functions. A "function" describes the hardware and/or software of an operation that may be provided by the PCI-based device. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some examples, the PCI-based device can include single-root I/O virtualization (SR-IOV). SR-IOV is an extended capability that may be included in a PCI-based device. SR-IOV allows a physical resource (e.g., a single network interface controller) to appear as multiple virtual resources (e.g., sixty-four network interface controllers). Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as, for example, a virtual machine) running on a host device.

In various implementations, the support systems 874 can include hardware for coordinating the operations of the acceleration engine 860. For example, the support systems 874 can include a microprocessor that coordinates the activities of the acceleration engine 860, including moving data around on the acceleration engine 860. In this example, the microprocessor can be an integrated circuit that can execute microcode. Microcode is program code that can enable an integrated circuit to have some flexibility in the operations that the integrated circuit can execute, but because the program code uses a limited instruction set, the microprocessor may have more limited capability than the host processor 872. In some examples, the program executed by the microprocessor is stored on the hardware of microprocessor, or on a non-volatile memory chip in the host system 800. In some examples, the microprocessor and the acceleration engine 860 can be on a chip, such as one integrated circuit on the same die and in the same package.

In some examples, the support systems 874 can be responsible for taking instructions from the host processor 872 when programs executing on the host processor 872 request the execution of a neural network. For example, the host processor 872 can provide the support systems 874 with a set of input data and a task that is to be performed on the set of input data. In this example, the support systems 874 can identify a neural network that can perform the task, and can program the acceleration engine 860 to execute the neural network on the set of input data. In some examples, the support systems 874 only needs to select an appropriate neural network processing engine of the neural network processor. In some examples, the support systems 874 may need to load the data for the neural network onto the acceleration engine 860 before the acceleration engine 860 can start executing the neural network. In these and other examples, the support systems 874 can further receive the output of executing the neural network, and provide the output back to the host processor 872.

In some examples, the operations of the support systems 874 can be handled by the host processor 872. In these examples, the support systems 874 may not be needed and can be omitted from the host system 800.

In various examples, the host system 800 can include a combination of host systems, processor nodes, storage subsystems, and I/O chassis that represent user devices, service provider computers or third party computers.

User devices can include computing devices to access an application (e.g., a web browser or mobile device application). In some examples, the application may be hosted, managed, and/or provided by a computing resources service or service provider. The application may enable a user to interact with the service provider computer to, for example, access web content (e.g., web pages, music, video, etc.). The user device may be a computing device such as, for example, a mobile phone, a smart phone, a personal digital assistant (PDA), a laptop computer, a netbook computer, a desktop computer, a thin-client device, a tablet computer, an electronic book (e-book) reader, a gaming console, etc. In some examples, the user device may be in communication with the service provider computer over one or more networks. Additionally, the user device may be part of the distributed system managed by, controlled by, or otherwise part of the service provider computer (e.g., a console device integrated with the service provider computers).

The host system 800 can also represent one or more service provider computers. A service provider computer may provide a native application that is configured to run on user devices, which users may interact with. The service provider computer may, in some examples, provide computing resources such as, but not limited to, client entities, low latency data storage, durable data storage, data access, management, virtualization, cloud-based software solutions, electronic content performance management, and so on. The service provider computer may also be operable to provide web hosting, databasing, computer application development and/or implementation platforms, combinations of the foregoing or the like. In some examples, the service provider computer may be provided as one or more virtual machines implemented in a hosted computing environment. The hosted computing environment can include one or more rapidly provisioned and released computing resources. These computing resources can include computing, networking and/or storage devices. A hosted computing environment may also be referred to as a cloud computing environment. The service provider computer may include one or more servers, perhaps arranged in a cluster, as a server farm, or as individual servers not associated with one another, and may host application and/or cloud-based software services. These servers may be configured as part of an integrated, distributed computing environment. In some examples, the service provider computer may, additionally or alternatively, include computing devices such as, for example, a mobile phone, a smart phone, a personal digital assistant (PDA), a laptop computer, a desktop computer, a netbook computer, a server computer, a thin-client device, a tablet computer, a gaming console, etc. In some instances, the service provider computer may communicate with one or more third party computers.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in the preceding figures, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain examples require at least one of X, at least one of Y, or at least one of Z to each be present.

Various examples of this disclosure are described herein, including the best mode known to the inventors for carrying out the disclosure. Variations of those examples may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A neural network accelerator, comprising:
   a local memory;
   a programmable address translation table;
   an address mapping direct memory access (DMA) queue to store address mapping direct memory access (DMA) descriptors, each of the address mapping DMA descriptors including, as a source address, a physical address of address mapping data between physical addresses of a host memory and indirect addresses, each of the address mapping DMA descriptors further including, as a destination address, a physical address of the programmable address translation table;
   an input data DMA descriptor queue configured to store input data DMA descriptors, each input data DMA descriptor including an indirect address as a source address;
   an output data DMA descriptor queue configured to store output data DMA descriptors, each output data DMA descriptor including an indirect address as a destination address;
   a DMA engine; and
   a hardware processor configured to execute instructions associated with a neural network operation to:
      control the DMA engine to fetch a first address mapping DMA descriptor from the address mapping DMA queue, and to fetch a first address mapping to the programmable address translation table based on executing the first address mapping DMA descriptor;
      program the programmable address translation table based on the first address mapping;
      control the DMA engine to fetch a subset of the input data DMA descriptors from the input data DMA descriptor queue, and to translate first indirect addresses of the subset of the input data DMA descriptors to first physical addresses of the host memory via the programmable address translation table and based on the first address mapping;
      control the DMA engine to transfer input data from the first physical addresses of the host memory to the local memory based on executing the subset of the input data DMA descriptors;
      perform the neural network operation based on the input data from the local memory to generate output data, and to store the output data at the local memory;
      control the DMA engine to fetch a subset of the output data DMA descriptors from the output data DMA descriptor queue, and to translate second indirect addresses of the subset of the output data DMA descriptors to second physical addresses of the host memory via the programmable address translation table and based on the first address mapping; and
      control the DMA engine to transfer the output data from the local memory to the second physical addresses of the host memory based on executing the subset of the output data DMA descriptors.

2. The neural network accelerator of claim 1, wherein the neural network operation is a first neural network operation; wherein the input data and the output data are, respectively, first input data and first output data; and wherein the subset of the input data DMA descriptors and the subset of the output DMA descriptors are reused for DMA operations of second input data and second output data of a second neural network operation performed by the hardware processor.

3. The neural network accelerator of claim 2, wherein the hardware processor is further configured to execute instructions associated with the second neural network operation to:
   control the DMA engine to fetch a second address mapping DMA descriptor from the address mapping DMA queue and to fetch a second address mapping to the programmable address translation table based on executing the second address mapping DMA descriptor;

program the programmable address translation table based on the second address mapping;

control the DMA engine to fetch the subset of the input data DMA descriptors from the input data DMA descriptor queue, and to translate the first indirect addresses of the subset of the input data DMA descriptors to third physical addresses of the host memory via the programmable address translation table based on the second address mapping;

control the DMA engine to transfer the second input data from the third physical addresses of the host memory to the local memory based on executing the subset of the input data DMA descriptors;

perform the second neural network operation based on the second input data from the local memory to generate the second output data, and to store the second output data at the local memory;

control the DMA engine to fetch the subset of the output data DMA descriptors from the output data DMA descriptor queue, and to translate the second indirect addresses of the subset of the output data DMA descriptors to fourth physical addresses of the host memory via the programmable address translation table and based on the second address mapping; and control the DMA engine to transfer the second output data from the local memory to the fourth physical address of the host memory based on executing the subset of the output data DMA descriptors.

4. The neural network accelerator of claim 1, wherein the indirect addresses of the input data DMA descriptors and of the output data DMA descriptors are not associated with any particular memory device prior to being mapped to physical addresses by the programmable address translation table.

5. The neural network accelerator of claim 1, wherein the programmable address translation table comprises a content addressable memory (CAM).

6. An apparatus comprising:
a local memory;
a direct memory access (DMA) descriptor queue that stores DMA descriptors, each DMA descriptor including an indirect address;
an address translation table that stores an address mapping between indirect addresses and physical addresses;
a hardware processor coupled with the local memory and configured to execute a computation operation; and
a DMA engine configured to:
fetch a DMA descriptor from the DMA descriptor queue;
translate, using the address translation table and based on the address mapping, a first indirect address of the DMA descriptor to a first physical address of a host memory; and
perform a DMA operation based on executing the DMA descriptor to transfer input data from the first physical address of the host memory to the local memory to be operated on by the hardware processor during the computation operation.

7. The apparatus of claim 6, further comprising the local memory coupled with a host processor and the host memory;
wherein the hardware processor is configured to, responsive to a request from the host processor, execute the computation operation based on the input data stored in the local memory; and wherein the hardware processor is configured to control the DMA engine to fetch the DMA descriptor from the DMA descriptor queue to perform the DMA operation between the local memory and the host memory to support the computation operation.

8. The apparatus of claim 7, wherein:
the DMA descriptor queue comprises an input data DMA descriptor queue and an output data DMA descriptor queue;
the DMA descriptor comprises an input data DMA descriptor; and
the hardware processor is configured to:
control the DMA engine to:
fetch the input data DMA descriptor from the input data DMA descriptor queue,
translate, using the address translation table, the first indirect address to the first physical address of the host memory, and
execute the input data DMA descriptor to perform a first DMA operation, the first DMA operation comprising transferring the input data from the first physical address of the host memory to the local memory;
perform the computation operation based on the first input data from the local memory to generate output data, and to store the output data in the local memory; and
control the DMA engine to:
fetch an output data DMA descriptor from the output data DMA descriptor queue,
translate, using the address translation table, a second indirect address of the output data DMA descriptor to a second physical address of the host memory, and
execute the output data DMA descriptor to perform a second DMA operation, the second DMA operation comprising transferring the output data from the local memory to the second physical address of the host memory.

9. The apparatus of claim 7, wherein the DMA descriptor comprises the first indirect address as a source address and a second indirect address as a destination address;
wherein the DMA engine is configured to forward the DMA descriptor to the address translation table to translate the first indirect address and the second indirect address to, respectively, the first physical address and a second physical address; and
wherein the DMA engine is configured to perform the DMA operation based on executing the DMA descriptor to transfer the input data from the first physical address to the second physical address.

10. The apparatus of claim 9, wherein the second physical address is of the local memory.

11. The apparatus of claim 7, wherein the address mapping is provided by the host processor to the address translation table.

12. The apparatus of claim 7, further comprising a data bus that couples the DMA engine with the host memory and the local memory;
wherein the address translation table is part of the data bus;
wherein the DMA engine is configured to generate a memory access request including the first indirect addresses; and
wherein the data bus is configured to use the address translation table to translate the first indirect address to the first physical address, and forward the memory access request including the first physical address to the host memory.

13. The apparatus of claim 7, wherein the computation operation is a first computation operation;
    wherein the address mapping is first address mapping associated with the first computation operation; and
    wherein the first indirect address of the DMA descriptor is mapped to a second physical address in the address translation table based on a second address mapping associated with a second computation operation.

14. The apparatus of claim 13, wherein the DMA operation is a first DMA operation; and
    wherein the address translation table receives the first address mapping and the second address mapping via, respectively, a second DMA operation and a third DMA operation.

15. The apparatus of claim 14, wherein the DMA descriptor queue is a first DMA descriptor queue;
    wherein the DMA descriptors are first DMA descriptors; and
    wherein the apparatus further comprises a second DMA descriptor queue to store a second DMA descriptor for the second DMA operation to fetch the first address mapping and a third DMA descriptor for the third DMA operation to fetch the second address mapping.

16. The apparatus of claim 15, wherein the hardware processor is configured to, based on executing a first set of instructions associated with the first computation operation:
    control the DMA engine to fetch the second DMA descriptor from the second DMA descriptor queue, and to execute the second DMA descriptor to fetch the first address mapping; and
    program the address translation table based on the first address mapping;
    wherein the hardware processor is configured to, after the first computation operation completes and based on executing a second set of instructions associated with the second computation operation:
    control the DMA engine to fetch the third DMA descriptor from the second DMA descriptor queue, and to execute the third DMA descriptor to fetch the second address mapping; and
    program the address translation table based on the second address mapping.

17. The apparatus of claim 16, wherein the address translation table comprises a content addressable memory (CAM).

18. The apparatus of claim 16, wherein each of the first computation operation and the second computation operation comprises a neural network operation; and
    wherein the apparatus is part of a neural network hardware accelerator.

19. A method, comprising:
    fetching a direct memory access (DMA) descriptor from a DMA descriptor queue that stores DMA descriptors, the DMA descriptor including a first indirect address;
    translating, using an address translation table that maps indirect addresses to physical addresses, the first indirect address to a first physical address of a host memory; and
    performing a DMA operation based on executing the DMA descriptor to transfer input data from the first physical address of the host memory to a local memory to be operated on by a hardware processor during a computation operation, the hardware processor coupled to the local memory.

20. The method of claim 19, wherein the DMA operation is a first DMA operation;
    wherein the DMA descriptor is a first DMA descriptor;
    wherein the DMA descriptor queue is a first DMA descriptor queue;
    wherein the method further comprises:
    fetching, from a second DMA descriptor queue, a second DMA descriptor;
    performing a second DMA operation based on the second DMA descriptor to obtain an address mapping between the indirect addresses and the physical addresses; and
    programming the address translation table with the address mapping prior to forwarding the first DMA descriptor to the address translation table.

* * * * *